United States Patent
Lee et al.

(10) Patent No.: US 10,157,572 B2
(45) Date of Patent: Dec. 18, 2018

(54) PIXEL DRIVER CIRCUITRY FOR A DISPLAY DEVICE

(71) Applicant: INNOLUX CORPORATION, Miao-Li County (TW)

(72) Inventors: Kuan-Feng Lee, Miao-Li County (TW); Yu-Hsien Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/478,874

(22) Filed: Apr. 4, 2017

(65) Prior Publication Data

US 2018/0122298 A1    May 3, 2018

Related U.S. Application Data

(60) Provisional application No. 62/429,162, filed on Dec. 2, 2016, provisional application No. 62/415,542, filed on Nov. 1, 2016.

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *H01L 25/0753* (2013.01); *H01L 25/167* (2013.01); *H01L 27/124* (2013.01); *H01L 27/1214* (2013.01); *H01L 27/1222* (2013.01); *H01L 27/1225* (2013.01);
(Continued)

(58) Field of Classification Search
CPC ............... G09G 3/3233; G09G 3/3266; G09G 2300/0452; H01L 25/167; H01L 27/1222; H01L 29/78645; H01L 25/0753; H01L 27/1255; H01L 27/124; H01L 27/1225; H01L 29/78675; H01L 29/7869
See application file for complete search history.

(56) References Cited

U.S. PATENT DOCUMENTS

| | | |
|---|---|---|
| 8,158,989 B2 | 4/2012 | Jung et al. |
| 2005/0243037 A1 | 11/2005 | Eom et al. |

(Continued)

OTHER PUBLICATIONS

Search Report for European Patent Application No. 17191518 dated Mar. 28, 2018.

*Primary Examiner* — Rodney Amadiz
(74) *Attorney, Agent, or Firm* — Patterson + Sheridan, LLP

(57) ABSTRACT

A display device comprises a first LED coupled with an input node, and further comprises pixel driver circuitry. The pixel driver circuitry comprises a data input transistor configured to conduct, based on a first control signal, a data signal across a first channel having a first channel W/L ratio. The pixel driver circuitry further comprises a drive transistor configured to conduct, based on the data signal, current across a second channel into the input node. The second channel has a second channel W/L ratio. The pixel driver circuitry further comprises a reset transistor configured to conduct, based on a received second control signal, a first reference voltage signal across a third channel into the input node. The third channel has a third channel W/L ratio. At least one of the first channel W/L ratio, the second channel W/L ratio, and the third channel W/L ratio is different.

18 Claims, 18 Drawing Sheets

(51) Int. Cl.
  *H01L 25/075* (2006.01)
  *H01L 25/16* (2006.01)
  *H01L 27/12* (2006.01)
  *H01L 29/786* (2006.01)
  *H01L 27/32* (2006.01)

(52) U.S. Cl.
  CPC ...... *H01L 27/1251* (2013.01); *H01L 27/1255* (2013.01); *H01L 27/326* (2013.01); *H01L 27/3262* (2013.01); *H01L 29/78645* (2013.01); *G09G 2300/0452* (2013.01); *H01L 29/7869* (2013.01); *H01L 29/78675* (2013.01)

(56) References Cited

U.S. PATENT DOCUMENTS

| | | | |
|---|---|---|---|
| 2007/0268220 A1* | 11/2007 | Lee | G09G 3/3241 345/76 |
| 2011/0234957 A1 | 9/2011 | Watanabe et al. | |
| 2011/0248245 A1 | 10/2011 | Hsieh | |
| 2012/0281159 A1* | 11/2012 | Chen | G02F 1/1345 349/40 |
| 2015/0014641 A1 | 1/2015 | Jung et al. | |
| 2015/0123084 A1 | 5/2015 | Kim et al. | |
| 2016/0163745 A1 | 6/2016 | Choi et al. | |

\* cited by examiner

US 10,157,572 B2

PIXEL DRIVER CIRCUITRY FOR A DISPLAY DEVICE

CROSS-REFERENCE TO RELATED APPLICATIONS

This application claims the benefit of U.S. Provisional Patent Application Ser. No. 62/415,542, filed Nov. 1, 2016, and U.S. Provisional Patent Application Ser. No. 62/429,162, filed Dec. 2, 2016, both of which are incorporated by reference in their entireties.

BACKGROUND

Field

Embodiments disclosed herein generally relates to pixel driver circuitry for a display device comprising one or more light emitting elements.

Description of the Related Art

Thin-film transistors (TFTs) are typically used to drive pixels of a display device. The selection of semiconductor materials for a TFT backplane impacts the size and overall performance of the display device. For example, a transistor formed from a semiconductor material having relatively greater electron mobility can provide relatively greater current to light emitting elements and/or faster switching, when compared with a same-sized transistor formed from another semiconductor material with a relatively lesser electron mobility. In this way, the transistor with the greater electron mobility may be dimensioned smaller while still meeting display device requirements, which in turn supports greater pixel densities and/or reduced power consumption. Further, other semiconductor materials may offer different benefits, and pixel driver circuitry for the display device may advantageously combine different materials to achieve a desired combination of different benefits.

SUMMARY

According to various embodiments disclosed herein, techniques are described for incorporating different semiconductor materials within pixel driver circuitry for a display device. In some cases, the pixel driver circuitry comprises at least a first transistor of a first semiconductor material having relatively greater electron mobility and/or relatively greater stability. The pixel driver circuitry further comprises at least a second transistor of a second semiconductor material having relatively greater threshold voltage uniformity. The first and second transistors are dimensioned to provide a desired combination of the benefits offered by each type of semiconductor material.

One embodiment described herein is a display device comprising at least a first light emitting diode coupled with an input node, and pixel driver circuitry comprising a data input transistor comprising a first control terminal configured to receive a first control signal, wherein the data input transistor is configured to conduct, based on the first control signal, a data signal across a first channel of the data input transistor having a first channel width-to-length (W/L) ratio. The pixel driver circuitry further comprises a drive transistor comprising a second control terminal configured to receive the data signal from the data input transistor, wherein the drive transistor is configured to conduct, based on the data signal, current across a second channel of the drive transistor into the input node, wherein the second channel has a second channel W/L ratio. The pixel driver circuitry further comprises a reset transistor comprising a third control terminal configured to receive a second control signal, wherein the reset transistor is configured to conduct, based on the second control signal, a first reference voltage signal across a third channel of the reset transistor into the input node, wherein the third channel has a third channel W/L ratio. At least one of the first channel W/L ratio, the second channel W/L ratio, and the third channel W/L ratio is different.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

Figure 1:
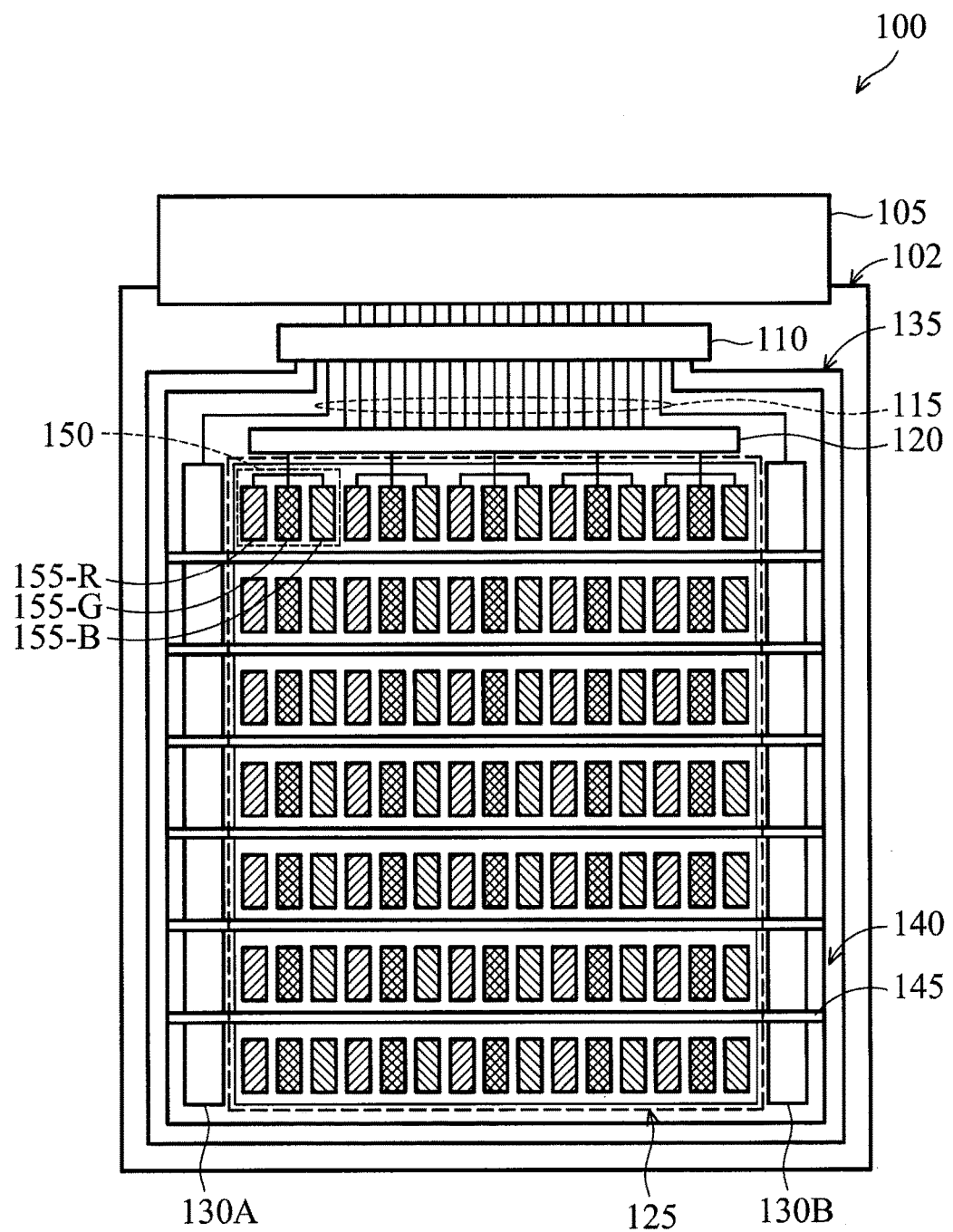
FIG. 1 illustrates an exemplary display device, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The

DETAILED DESCRIPTION

Various embodiments disclosed herein provide display devices that incorporate different semiconductor materials within associated pixel driver circuitry. At least two transistors of the pixel driver circuitry are formed of different semiconductor materials to achieve a desired combination of benefits offered by each type of semiconductor material.

In some embodiments, a first semiconductor layer including at least a first transistor of the pixel driver circuitry is formed of a semiconductor material such as low-temperature polycrystalline silicon (LTPS), and a second semiconductor layer including at least a second transistor of the pixel driver circuitry is formed of an oxide semiconductor material such as indium gallium zinc oxide (IGZO). The first transistor generally provides relatively greater electron mobility and/or relatively greater stability than the second transistor, and the second transistor generally provides a greater threshold voltage uniformity than the first transistor. Further, although the example combination of LTPS and IGZO is specifically mentioned, the techniques that are described herein are not limited to this combination. Indeed, other implementations of the pixel driver circuitry may include transistors of any other suitable type(s) of semiconductor material, whether now known or later developed.

Exemplary Display Device Implementation

FIG. 1 illustrates an exemplary display device 100 from a top view, according to embodiments described herein. The display device 100 comprises a substrate 102 coupled with a flexible printed circuit 105. An integrated circuit (IC) 110 is disposed on the substrate 102 and is configured to control operation of display units of the display device 100. In other embodiments, the IC 110 is disposed on the flexible printed circuit 105. The IC 110 is configured to communicate through the flexible printed circuit 105 with an external processor. In some cases, the display device 100 forms part of an integrated device, and the external processor comprises a host processor of the integrated device. For example, the IC 110 may receive display data and/or control data from the host processor, and may then provide appropriate display signals and/or control signals to operate the various display units of the display device 100. As shown, the IC 110 provides display signals and/or control signals over a plurality of conductive connections 115 to a de-multiplexer 120 and to gate driver circuitry included in gate driver regions 130A, 130B. Generally, the de-multiplexer 120 allows for a reduced number of conductive connections 115 required between the IC 110 and the display units of the display device 100. In some cases, the number of display units can be on the order of thousands, millions, or greater.

The display device 100 comprises an active region 125 in which imagery is displayed using one or more of the display units. As shown, the display unit corresponds to a pixel 150. As shown, the active region 125 comprises M×N pixels 150 that are arranged in a pattern of M rows and N columns, where M and N are each positive integers, the active region 125 may include any alternate number of pixels 150 having any suitable spatial arrangement. As highlighted in the inset of FIG. 1, each pixel 150 may comprise at least one sub-pixel: a red sub-pixel 155-R, a green sub-pixel 155-G, and a blue sub-pixel 155-B (sub-pixels of any type may be generally referred to as sub-pixels 155). The pixels 150 may include any suitable alternate number of sub-pixels 155, which in some cases may be based on a color model different than the RGB color model. In other embodiments, the pixels 150 may each include one sub-pixel (e.g., white sub-pixel, red sub-pixel, green sub-pixel, or blue sub-pixel). In other embodiments, the pixels 150 may each include a plurality of sub-pixels (e.g., RGB color model, RGBW color model, RGBY color model, RGBG color model, or RBGB color model).

Each sub-pixel 155 includes one or more light emitting elements, such as LEDs (inorganic light-emitting diodes), organic light-emitting diodes (OLEDs) or other type of light emitting elements. In one example, the display device 100 is a LED display and individual LEDs are generally operated to produce a selected color of light (e.g., red, green, or blue for the RGB color model). In another example, the display device 100 is an OLED display and individual OLEDs are generally operated to produce a selected color of light (e.g., red, green, or blue for the RGB color model). Further, although the examples of LED displays and OLED displays are specifically mentioned, the techniques that are described herein are not limited to these types of displays. Indeed, other implementations of the display device 100 may include any other suitable display technologies, whether now known or later developed.

Outside of the active region 125, gate driver circuitry that is coupled with the pixels 150 is disposed on the substrate 102 and arranged in gate driver regions 130A, 130B. Other implementations of the display device 100 may include a different number and/or arrangement of gate driver regions, such a single gate driver region. When the display device 100 is included in an integrated device, those elements of the display device 100 that are arranged outside the active region 125 (such as the gate driver circuitry) may be masked and not generally visible to a viewer. In other embodiments, those elements of the display device 100 (such as the gate driver circuitry) may be arranged within the active region 125. As shown, a common electrode (or ground electrode) 135 is partially disposed outside the active region 125 and is partially disposed inside the active region 125. In other embodiments, the common electrode 135 covers more than a half of an area of active region 125. The common electrode 135 is coupled with the IC 110 and provides a reference voltage to the pixels 150.

In some embodiments, the common electrode 135 comprises a conductive ring 140 that is configured to substantially circumscribe the active region 125, and further comprises a plurality of conductive lines 145 that extend across the active region 125 and are coupled with the conductive ring 140. However, other implementations of the common electrode 135 need not circumscribe the active region. In some embodiments, each conductive line 145 defines a first end and a second end, and the first end and the second end of each conductive line 145 are connected to the conductive ring 140. In some embodiments, a width of each of the conductive lines 145 is smaller than a width of the conductive ring 140, as a smaller width of the conductive lines 145 typically supports greater pixel densities within the active region 125. In other embodiments, the conductive lines 145 may be replaced by a conductive plate that is connected to the conductive ring 140 and that covers more than a half of an area of the active region 125.

Exemplary Pixel Driver Circuitry Implementations

Figure 2:
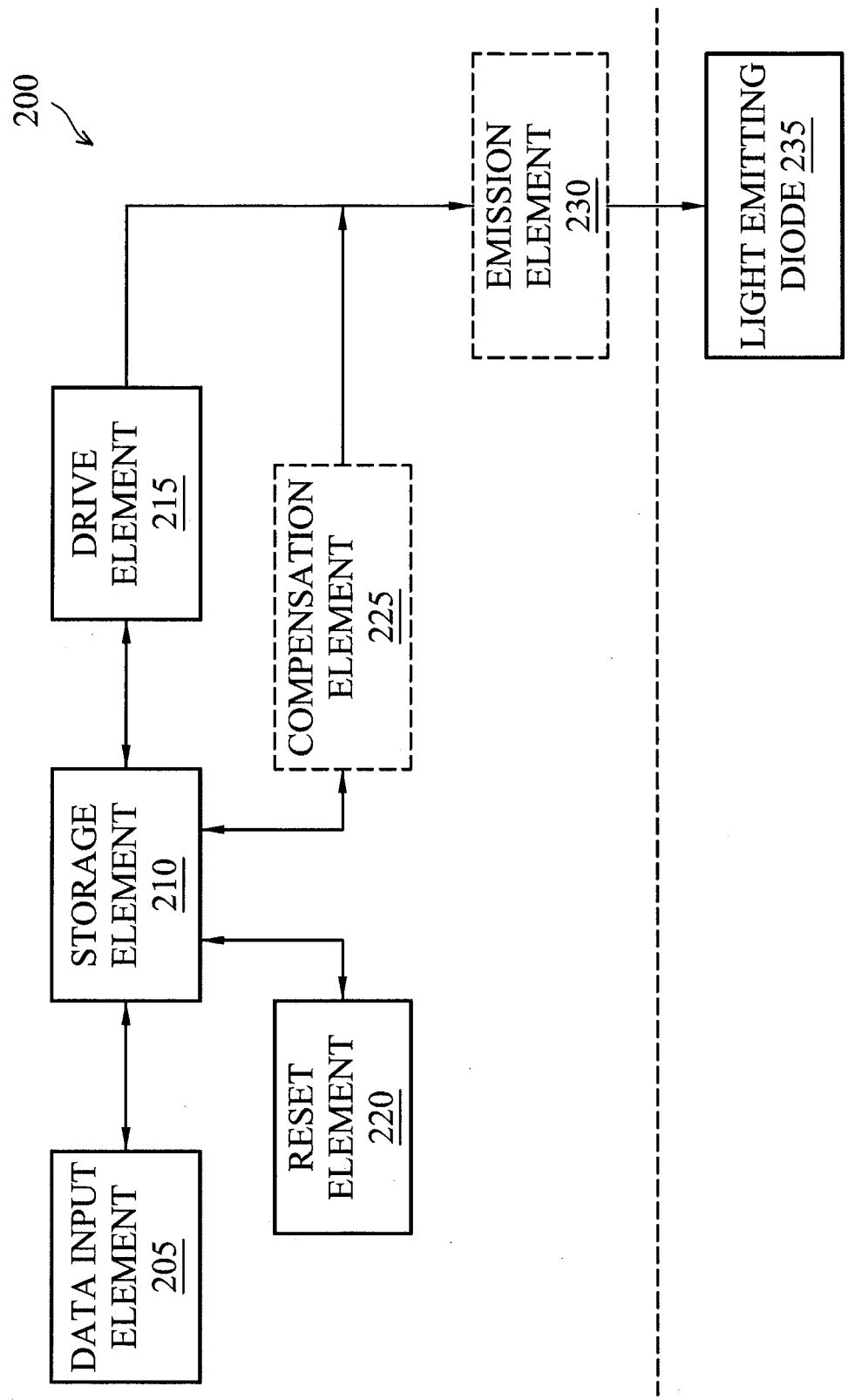
FIG. 2 is a schematic block diagram of exemplary pixel driver circuitry, according to embodiments described herein.

FIG. 2 is a schematic block diagram of exemplary pixel driver circuitry 200, according to embodiments described herein. As shown, the pixel driver circuitry 200 comprises a data input element 205, a storage element 210, a drive element 215, and a reset element 220. The pixel driver circuitry 200 is configured to drive one or more light emitting elements, such as light emitting diode (LED) 235 with micron size (also called Micro-LED). In some embodiments, LED 235 has a size (e.g., a diameter or a width of the longest edge) between about ten (10) microns and about one hundred (100) microns. Alternate embodiments may include LEDs 235 of any suitable alternate size (diameter or the longest edge width), such as less than ten (10) microns and greater than one (1) micron.

The data input element 205 is generally configured to selectively conduct a data signal to the drive element 215. The data signal may be provided by an associated processor, such as IC 110 of FIG. 1. The data signal may comprise different states, such as a reference voltage and a data voltage. The storage element 210 is generally configured to maintain a value of the data signal for input to the drive element 215. The drive element 215 is generally configured to supply, based on the data signal, a drive current to the light emitting diode 235. The reset element 220 is generally configured to selectively conduct current and thereby reset a voltage of the drive element 215 to a predetermined voltage.

The pixel driver circuitry 200 optionally comprises a compensation element 225 and/or an emission element 230. The emission element 230 is generally configured to control whether the LED 235 is in an emitting state or a non-emitting state. In some embodiments, the emission element 230 is disposed in series with the drive element 215. The compensation element 225 is generally configured to compensate for poor threshold voltage uniformity of a semiconductor material of the drive element 215 in the pixel driver circuitry 200.

Figure 3:
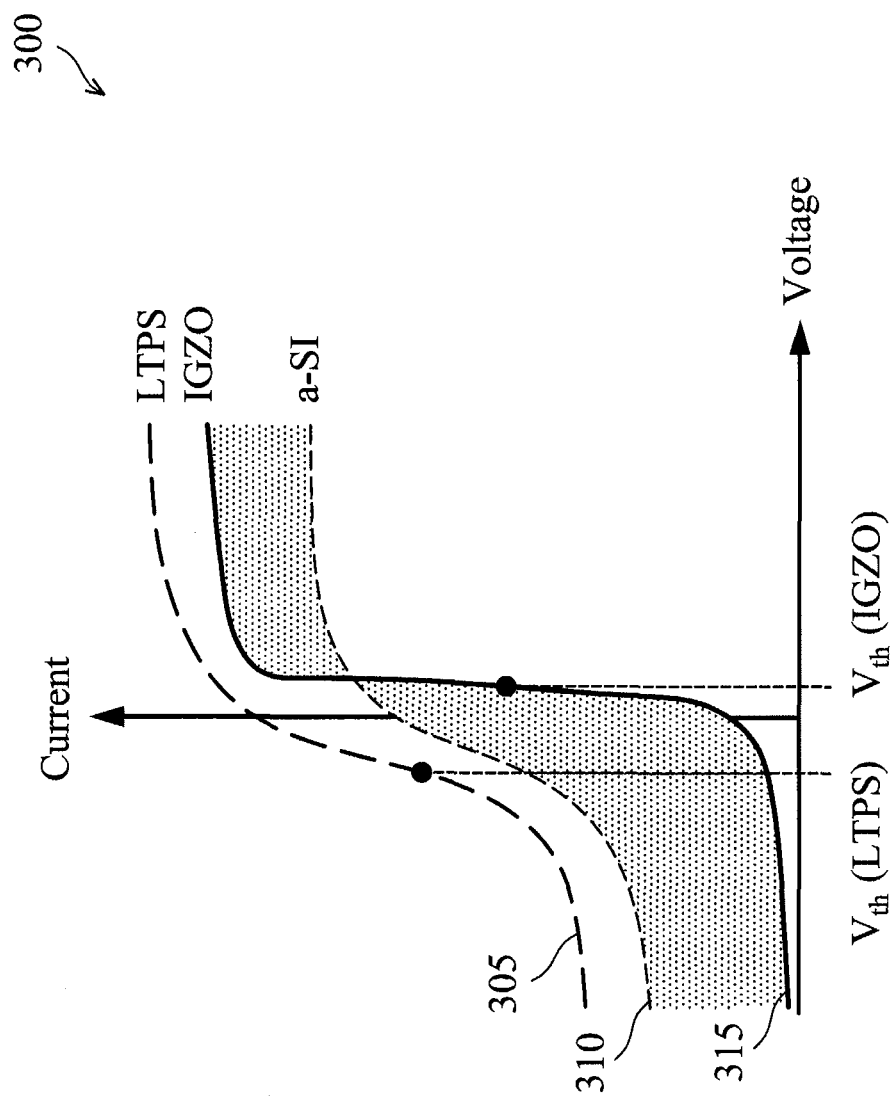
FIG. 3 is a graph illustrating a current/voltage characteristic for transistors formed of different semiconductor materials, according to embodiments described herein.

FIG. 3 is a graph 300 illustrating a current/voltage characteristic for transistors formed of different semiconductor materials, according to embodiments described herein. More specifically, the graph 300 includes plot 305 illustrating a current/voltage characteristic for a transistor formed from a low temperature poly-silicon (LTPS) semiconductor material, plot 310 illustrating a current/voltage characteristic for a transistor formed from an amorphous silicon (a-Si) semiconductor material, and plot 315 illustrating a current/voltage characteristic for a transistor formed from an indium gallium zinc oxide (IGZO) semiconductor material. A threshold voltage for the IGZO semiconductor material transistor ($V_{th}$ (IGZO)) is greater than a threshold voltage for the LTPS semiconductor material transistor ($V_{th}$ (LTPS)). As is known in the art, the threshold voltage of a transistor represents a minimum gate-to-source voltage differential that is needed to form a conducting path across the channel (i.e., between the source and drain terminals) of the transistor.

Generally, the LTPS semiconductor material and IGZO semiconductor material each provide significantly greater electron mobility than the a-Si semiconductor material. In some cases, the electron mobility for IGZO semiconductor material is on the order of 20-50 times greater than for a-Si semiconductor material; the electron mobility for LTPS semiconductor material is on the order of 100 times greater (or more) than for a-Si semiconductor material. The increased electron mobility generally corresponds to a smaller size of the transistor while meeting display device requirements, which supports higher pixel densities and smaller display devices and/or higher resolution display devices. Further, the increased electron mobility corresponds to a reduced power consumption of the display devices.

As shown in graph 300, the IGZO semiconductor material provides a significantly lower leakage current (i.e., the values of current at voltages less than the corresponding threshold voltage) than LTPS semiconductor material. Additionally, the IGZO semiconductor material provides a relatively greater threshold voltage uniformity than either a-Si semiconductor material or LTPS semiconductor material. Visually, the threshold voltage uniformity is illustrated in the cycling transition between the "off" state (i.e., voltage values less than the corresponding threshold voltage) and the "on" state (i.e., voltage values at or greater than the corresponding threshold voltage). The slope of plot 315 around the threshold voltage $V_{th}$ (IGZO) is relatively sharper or steeper than the slope of either plot 305 (LTPS) or plot 310 (a-Si) around the corresponding threshold voltage, illustrating a better defined transition between the "off" state and "on" state of the transistor. As discussed above, in alternate implementations transistors of the pixel driver circuitry may be formed of different semiconductor material(s), which have differing properties such as electron mobility, leakage current, threshold voltage uniformity, and so forth.

In various embodiments, a combination of different semiconductor materials is employed within pixel driver circuitry of a display device to achieve benefits of each material type. In one non-limiting example, a drive transistor of the pixel driver circuitry may be implemented in an IGZO semiconductor material, which due to the greater threshold voltage uniformity can mitigate differences in light emitted by different LEDs of the display device. The greater uniformity of the light emitted by different LEDs generally provides better overall performance of the display device. In this example, one or more other transistors of the pixel driving circuit (such as an emission transistor) may be implemented in LTPS for better stability.

Figure 4A:
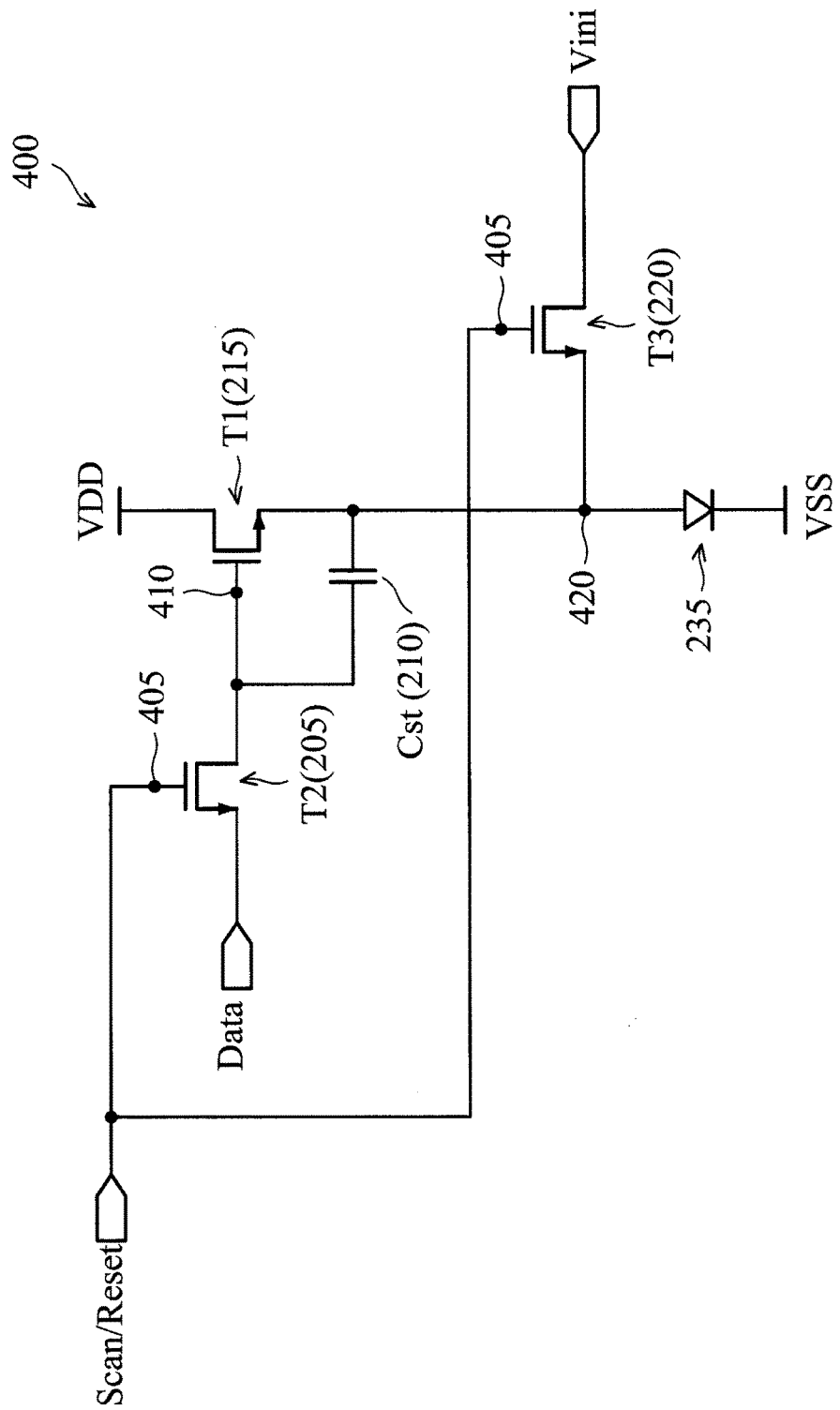
FIG. 4A is a circuit diagram illustrating an exemplary arrangement of pixel driver circuitry, according to embodiments described herein.

FIG. 4A is a circuit diagram illustrating an exemplary arrangement 400 of pixel driver circuitry, according to embodiments described herein. The arrangement 400 represents one possible implementation of the pixel driver circuitry 200 of FIG. 2.

The arrangement 400 comprises a drive transistor T1 (representing an example of drive element 215), a data input transistor T2 (representing an example of data input element 205), and a reset transistor T3 (representing an example of reset element 220). The data input transistor T2 comprises a first control terminal 405 configured to receive a first control signal. As shown in FIG. 4A, the first control signal is a combined control signal ("Scan/Reset") that is shared with the reset transistor T3, but alternate implementations may include independent Scan and Reset control signals. Based on the first control signal, the data input transistor T2 is configured to conduct a data signal ("Data") across a first channel of the data input transistor T2.

The drive transistor T1 comprises a second control terminal 410 configured to receive the data signal from the data input transistor T2. Based on the data signal, the drive transistor T1 is configured to conduct current across a second channel of the drive transistor T1 into an input node 420. As shown, the drive transistor T1 is configured to couple a first supply voltage (VDD) with the input node 420.

A storage capacitor Cst is coupled between the second control terminal 410 and the input node 420. The storage capacitor Cst represents an example of storage element 210, and is configured to maintain values of the data signal at the second control terminal 410.

The reset transistor T3 comprises a third control terminal 415 configured to receive a second control signal. Based on the second control signal, the reset transistor T3 is configured to conduct a first reference voltage signal ("Vini") across a third channel of the reset transistor T3 into the input node 420. As shown in FIG. 4A, the second control signal is the combined control signal.

LED 235 is coupled between the input node 420 and a second supply voltage (VSS; alternately "VCOM" or "ground"). As shown, an anode of the LED 235 is connected with input node 420 and a cathode of the LED 235 is connected with VSS. However, other implementations may have the anode and cathode of the LED 235 reversed.

The first channel of the data input transistor T2 has a first channel width-to-length (W/L) ratio. The second channel of the drive transistor T1 has a second channel W/L ratio. The third channel of the reset transistor T3 has a third channel W/L ratio. In some embodiments, at least one of the first channel W/L ratio, the second channel W/L ratio, and the third channel W/L ratio is different. Described another way, one condition is that two channel W/L ratios of the transistors are the same, and the same channel W/L ratio is different from the other one transistor's channel W/L ratio, and another condition is that all channel W/L ratios of the transistors are different. As is known in the art, a channel W/L ratio describes the geometry of a particular transistor and affects the conduction parameter of the transistor.

Formerly, considerations of process costs required process uniformity such that implementations of pixel driver circuitry have a same channel W/L ratio for each transistor (e.g., transistors T1, T2, T3). However, in various embodiments described herein, providing different channel W/L ratios for different transistors of the pixel driver circuitry can provide improved performance of the display device. This improved performance can also be achieved for embodiments of the pixel driver circuitry having transistors of different semiconductor material types.

In some embodiments, the second channel W/L ratio of the drive transistor is smaller than the first channel W/L ratio and is smaller than the third channel W/L ratio. Example ranges of width and length for transistors T1, T2, and T3 are provided in Table 1 below. Table 1 also includes minimum and maximum values of the channel W/L ratio that are based on the ranges of width and length. Table 1 also provides a width, length, and corresponding W/L ratio for a preferred embodiment of the pixel driver circuitry.

TABLE 1

Example transistor dimensions for arrangements 400, 500

| Transistor | W (μm) | L (μm) | W/L ratio (min) | W/L ratio (max) | Preferred W, L (μm) | Preferred W/L ratio |
|---|---|---|---|---|---|---|
| T1 | 2-6 | 12-25 | 0.080 | 0.5 | 3, 18.5 | 0.162 |
| T2 | 2-6 | 2-12 | 0.167 | 3 | 3, 6 | 0.500 |
| T3 | 2-6 | 2-12 | 0.167 | 3 | 3, 6 | 0.500 |
| T4 | 2-6 | 2-12 | 0.167 | 3 | 3, 3 | 1.000 |

In some embodiments, transistors T1, T2, T3 are formed of a single semiconductor material type. In one example, transistors T1, T2, T3 are each formed of a LTPS semiconductor material. In some cases, however, an all-LTPS implementation of arrangement 400 may not be suitable as the relatively poor threshold voltage uniformity of the LTPS semiconductor material is not compensated by other circuitry within the arrangement 400. In another example, transistors T1, T2, T3 are each formed of an IGZO semiconductor material. For this particular case, example ranges of width, length, and so forth are provided in Table 3 below.

In other embodiments, at least one of the transistors T1, T2, T3 is formed of a different material type. In one example, the drive transistor T1 is formed of IGZO semiconductor material while data input transistor T2 and reset transistor T3 are formed of LTPS semiconductor material. Consistent with the discussion above, other combinations of the transistors T1, T2, T3 with the IGZO semiconductor material and the LTPS semiconductor material are also possible.

Figure 4B:
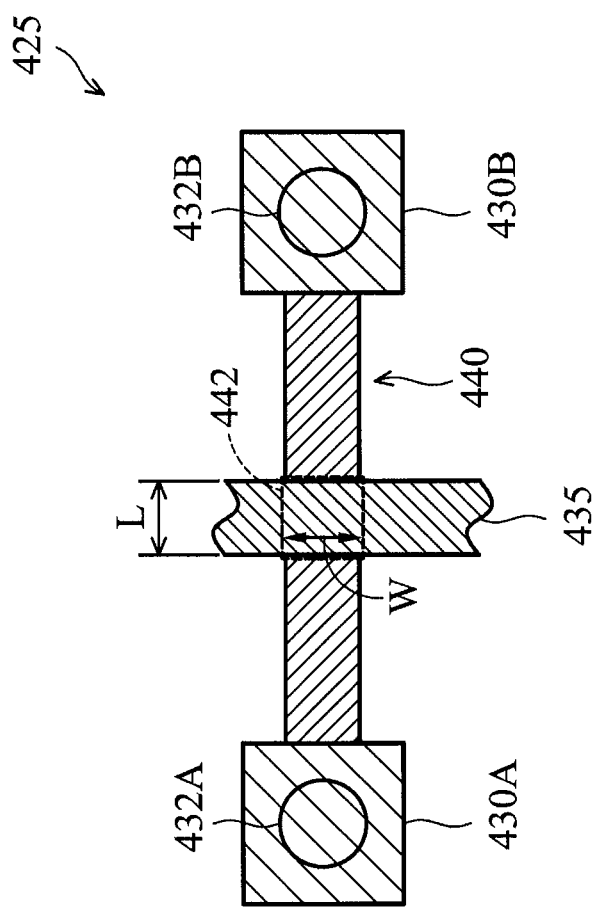
FIG. 4B illustrates an exemplary transistor arrangement, according to embodiments described herein.

FIG. 4B illustrates an exemplary transistor arrangement 425, according to embodiments described herein. The arrangement 425 may generally be used for any single gate transistor that is described herein, such as the transistors T1, T2, T3 of FIG. 4A, as well as other single gate transistor that is described below.

The arrangement 425 includes a first source/drain (S/D) terminal 430A and a second S/D terminal 430B. Although not explicitly depicted, the first S/D terminal 430A and the second S/D terminal 430B may be coupled with other circuitry at the same layer and/or at other layers of the display device through conductive contacts. The first S/D terminal 430A and the second S/D terminal 430B are disposed at two opposite sides of a semiconductor layer 440, the first S/D terminal 430A is coupled to the semiconductor layer 440 through a first via 432A, and the second S/D terminal 430B is coupled to the semiconductor layer 440 through a second via 432B. The first via 432A and the second via 432B penetrate through an insulating layer which is disposed between semiconductor layer 440 and the first S/D terminal 430A (or the second S/D terminal 430B). A gate terminal 435 overlaps with the semiconductor layer 440 to form a channel 442, the channel 442 is disposed between the first S/D terminal 430A and the second S/D terminal 430B, and the portion of the channel 442 defines a width W and a length L that is used to describe the channel W/L ratio for the transistor.

Figure 5:
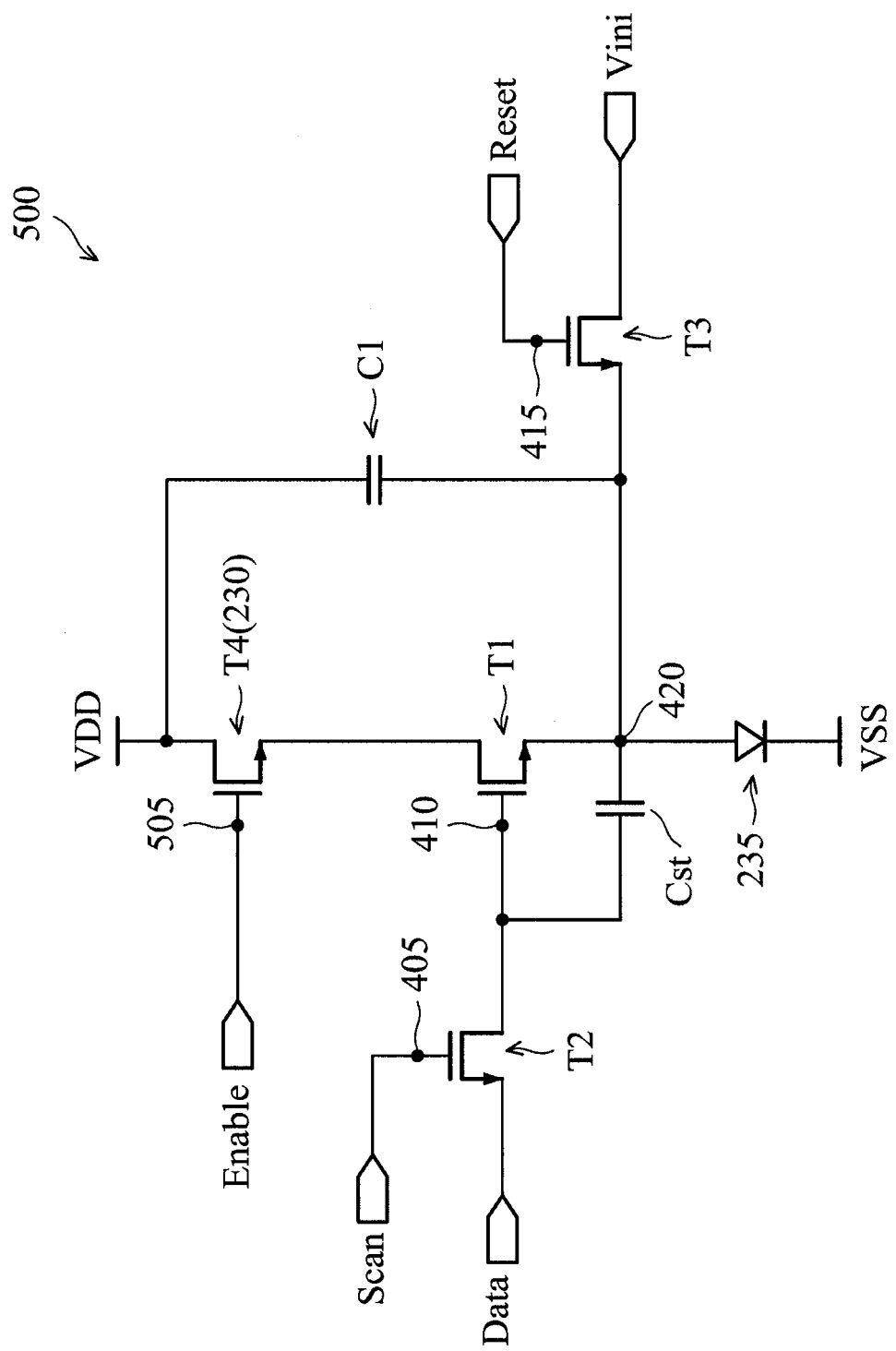
FIG. 5 is a circuit diagram illustrating an exemplary arrangement of pixel driver circuitry, according to embodiments described herein.

FIG. 5 is a circuit diagram illustrating an exemplary arrangement 500 of pixel driver circuitry, according to embodiments described herein. The arrangement 500 represents one possible implementation of the pixel driver circuitry 200 of FIG. 2. The arrangement 500 comprises the drive transistor T1, the data input transistor T2, and the reset transistor T3. The arrangement 500 further comprises an emission transistor T4 comprising a fourth control terminal 505 configured to receive a third control signal ("Enable") for selectively enabling current conduction across the second channel of the drive transistor T1. As shown, individual control signals are provided to the control terminal 405 ("Scan") and control terminal 415 ("Reset"). The arrangement 500 further comprises a second storage capacitor C1 coupled between a supply voltage (VDD) and the input node 420.

A plurality of states of the pixel driver circuitry are described in Table 2. In a first, pre-charge state, the Scan, Enable, and Reset signals are "ON" or in a logic "high" state. The Data signal has a value of a first reference voltage ($V_{ref}$), and the voltage at control terminal 410 ($V_{410}$) of drive transistor T1 equals $V_{ref}$. The voltage at the input node 420 ($V_{420}$) equals a second reference voltage ($V_{ini}$) provided through the reset transistor T3. In a second, compensation state, the Scan and Enable signals are "ON" and the Reset signal is "OFF" or in a logic "low" state. The Data signal has a value of the first reference voltage $V_{ref}$, and voltage $V_{410}$ equals $V_{ref}$. The voltage $V_{420}$ equals ($V_{ref}-V_{th}$), where $V_{th}$ is the threshold voltage of drive transistor T1. Providing the combination of the pre-charge state and the compensation state allows the pixel driver circuitry to mitigate issues with threshold voltages uniformity, such as a relatively poor threshold voltage uniformity of certain materials (e.g., LTPS) and/or differences in threshold voltages between different semiconductor materials.

In a third, data writing state, the Scan signal is "ON" and the Enable and Reset signals are "OFF". The Data signal has a value of $V_{data}$ and voltage $V_{410}$ equals $V_{data}$. The voltage $V_{420}$ equals $\{V_{ref}-V_{th}+f^*(V_{data}-V_{ref})\}$, where f is a function that equals $\{f=Cst/(Cst+C1)\}$. In a fourth, emitting state, the Scan and Reset signals are "OFF" and the Enable signal is "ON". The Data signal has a value of the first reference voltage $V_{ref}$. In turn, the voltage $V_{410}$ equals $\{V_{data}+V_{420}-V_{ref}-V_{th}+f^*(V_{data}-V_{ref})\}$.

TABLE 2

Example states for arrangement 500

| State | Data | Scan | Enable | Reset | $V_{410}$ | $V_{420}$ |
|---|---|---|---|---|---|---|
| Precharge | $V_{ref}$ | ON | ON | ON | $V_{ref}$ | $V_{ini}$ |
| Compensation | $V_{ref}$ | ON | ON | OFF | $V_{ref}$ | $V_{ref} - V_{th}$ |
| Data writing | $V_{data}$ | ON | OFF | OFF | $V_{data}$ | $V_{ref} - V_{th} + f * (V_{data} - V_{ref})$ |
| Emitting | $V_{ref}$ | OFF | ON | OFF | $V_{data} + V_{420} - V_{ref} - V_{th} + f * (V_{data} - V_{ref})$ | $V_{420}$ |

Example ranges of width and length for transistors T1, T2, T3, and T4 are provided in Table 1 above. Table 1 also includes minimum and maximum values of the channel W/L ratio that are based on the ranges of width and length. Table 1 also provides a width, length, and corresponding W/L ratio for a preferred embodiment of the pixel driver circuitry.

In some embodiments, transistors T1, T2, T3, T4 are formed of a single semiconductor material type. In one example, transistors T1, T2, T3, T4 are each formed of a LTPS semiconductor material. However, in contrast with the arrangement 400 of FIG. 4, arrangement 500 includes a compensation functionality that is capable of mitigating the relatively poor threshold voltage uniformity of the LTPS semiconductor material. Further, and as will be discussed below with respect to FIG. 6A, alternate embodiments of the pixel driver circuitry may use a dual gate design to mitigate a relatively high leakage current such as that associated with LTPS semiconductor material.

In some embodiments, at least one of the transistors T1, T2, T3, T4 is formed of a different semiconductor material type. In one example, the drive transistor T1, data input transistor T2, and reset transistor T3 are each formed of IGZO semiconductor material while the emission transistor T4 is formed of LTPS semiconductor material. Beneficially, using LTPS semiconductor material provides relatively greater stability for the emission transistor T4, while maintaining the performance advantages provided by the greater threshold voltage uniformity of IGZO semiconductor material. Example ranges of width and length for transistors T1, T2, T3, and T4 of arrangement 500 are provided in Table 3 below. Table 3 also includes minimum and maximum values of the channel W/L ratio that are based on the ranges of width and length. Table 3 also provides a width, length, and corresponding W/L ratio for a preferred embodiment of the pixel driver circuitry.

TABLE 3

Example transistor dimensions for arrangement 500

| Transistor | W (μm) | L (μm) | W/L ratio (min) | W/L ratio (max) | Preferred W, L (μm) | Preferred W/L ratio |
|---|---|---|---|---|---|---|
| T1 (IGZO) | 2-6 | 12-25 | 0.080 | 0.5 | 3, 15 | 0.200 |
| T2 (IGZO) | 2-6 | 2-12 | 0.167 | 3 | 3, 3 | 1.000 |
| T3 (IGZO) | 2-6 | 2-12 | 0.167 | 3 | 3, 3 | 1.000 |
| T4 (LTPS) | 2-6 | 2-12 | 0.167 | 3 | 3, 3 | 1.000 |

Consistent with the discussion above, other combinations of the transistors T1, T2, T3, T4 with the IGZO semiconductor material and the LTPS semiconductor material, or with different semiconductor materials are also possible.

Figure 6A:
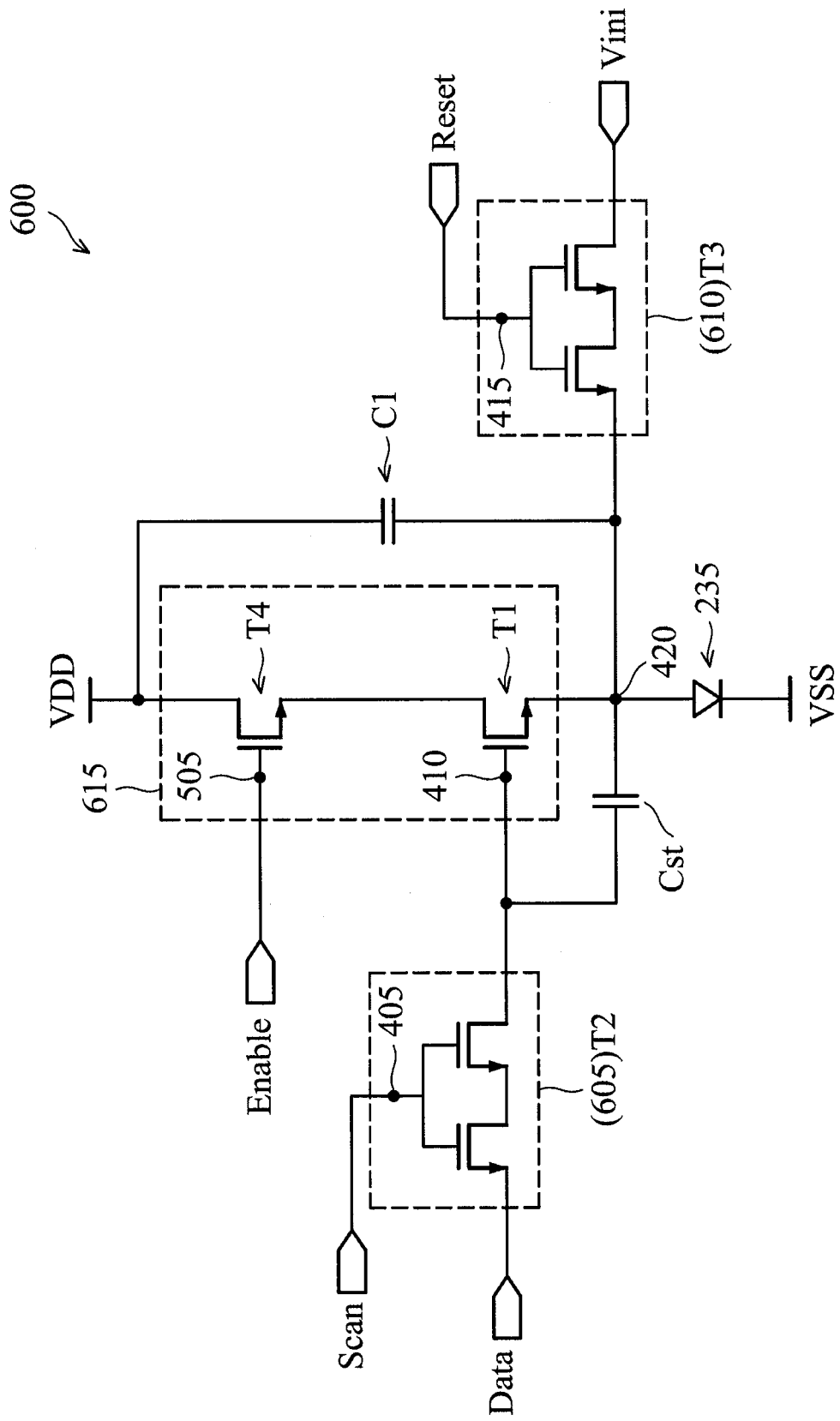
FIG. 6A is a circuit diagram illustrating an exemplary arrangement of pixel driver circuitry, according to embodiments described herein.

FIG. 6A is a circuit diagram illustrating an exemplary arrangement 600 of pixel driver circuitry, according to embodiments described herein. The arrangement 600 represents one possible implementation of the pixel driver circuitry 200 of FIG. 2. The arrangement 600 comprises the drive transistor T1, the data input transistor T2, the reset transistor T3, and the emission transistor T4. As shown, the data input transistor T2 forms a first dual gate transistor 605, the reset transistor T3 forms a second dual gate transistor 610, and the drive transistor T1 and the emission transistor T4 form a third dual gate transistor 615.

Generally, the dual gate transistor implementation can mitigate a relatively high leakage current for an associated material (e.g., LTPS semiconductor material). Table 4 below provides example ranges of width and length for transistors T1, T2, T3, and T4 of arrangement 600 that are each formed in LTPS semiconductor material.

TABLE 4

Example transistor dimensions for arrangement 600

| Transistor | W (μm) | L (μm) | W/L ratio (min) | W/L ratio (max) | Preferred W, L (μm) | Preferred W/L ratio |
|---|---|---|---|---|---|---|
| T1 | 2-6 | 12-25 | 0.080 | 0.5 | 3, 18.5 | 0.162 |
| T2 | 2-6 | 2-12 | 0.167 | 3 | 3, (3 + 3) | 0.500 |
| T3 | 2-6 | 2-12 | 0.167 | 3 | 3, (3 + 3) | 0.500 |
| T4 | 2-6 | 2-12 | 0.167 | 3 | 3, 3 | 1.000 |

While each of the transistors T1, T2, T3, T4 is shown in arrangement 600 as being included in a dual gate transistor implementation, other embodiments may have different numbers of dual gate transistors. In one example, only a selected one of transistor T2 and transistor T3 has a dual gate transistor implementation, while each of the other transistors has a single gate transistor implementation.

In some embodiments, at least one of the transistors T1, T2, T3, T4 is formed of a different semiconductor material type. In one example, the drive transistor T1 is formed of IGZO semiconductor material while the data input transistor T2, reset transistor T3, and emission transistor T4 are each formed of LTPS semiconductor material. Each of the data input transistor T2 and the reset transistor has a dual gate transistor implementation. Example ranges of width and length for transistors T1, T2, T3, and T4 of arrangement 600 are provided in Table 5 below. Table 5 also includes minimum and maximum values of the channel W/L ratio that are based on the ranges of width and length. Table 5 also provides a width, length, and corresponding W/L ratio for a preferred embodiment of the pixel driver circuitry.

TABLE 5

Example transistor dimensions for arrangement 600

| Transistor | W (μm) | L (μm) | W/L ratio (min) | W/L ratio (max) | Preferred W, L (μm) | Preferred W/L ratio |
|---|---|---|---|---|---|---|
| T1 (IGZO) | 2-6 | 12-25 | 0.080 | 0.5 | 3, 15 | 0.200 |
| T2 (LTPS) | 2-6 | 2-12 | 0.167 | 3 | 3, (3 + 3) | 0.500 |
| T3 (LTPS) | 2-6 | 2-12 | 0.167 | 3 | 3, (3 + 3) | 0.500 |
| T4 (LTPS) | 2-6 | 2-12 | 0.167 | 3 | 3, 3 | 1.000 |

Consistent with the discussion above, other combinations of the transistors T1, T2, T3, T4 with the IGZO semiconductor material and the LTPS semiconductor material, or with different semiconductor materials are also possible. Further, the dual gate feature may be extended to other arrangements, such as the arrangement 400 of FIG. 4A, with similar benefits. For example, arrangement 400 may be modified such that drive transistor T1 is formed of IGZO semiconductor material while data input transistor T2 and reset transistor T3 are formed of LTPS semiconductor material. The dimensions of the transistors T1, T2, T3 generally correspond to the range provided in Table 5. Each of the data input transistor T2 and reset transistor T3 has a dual gate transistor implementation to mitigate the leakage current of the LTPS semiconductor material.

Figure 6B:
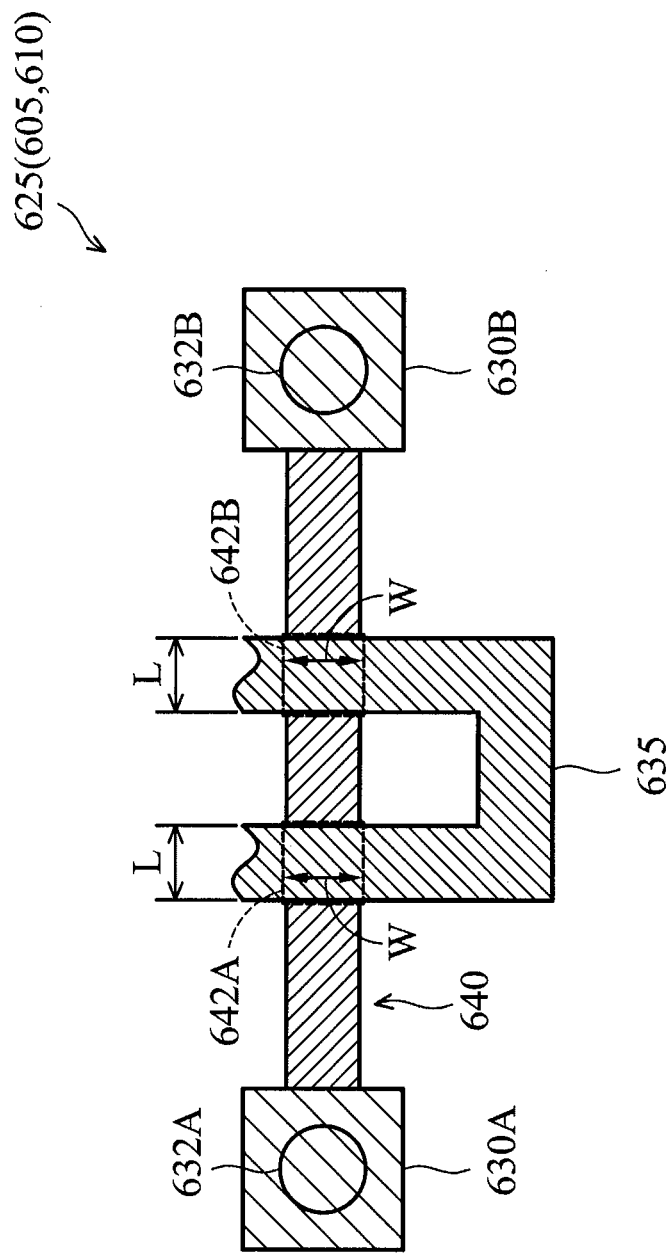
FIGS. 6B and 6C illustrate exemplary dual gate transistor arrangements, according to embodiments described herein.
Figure 6C:
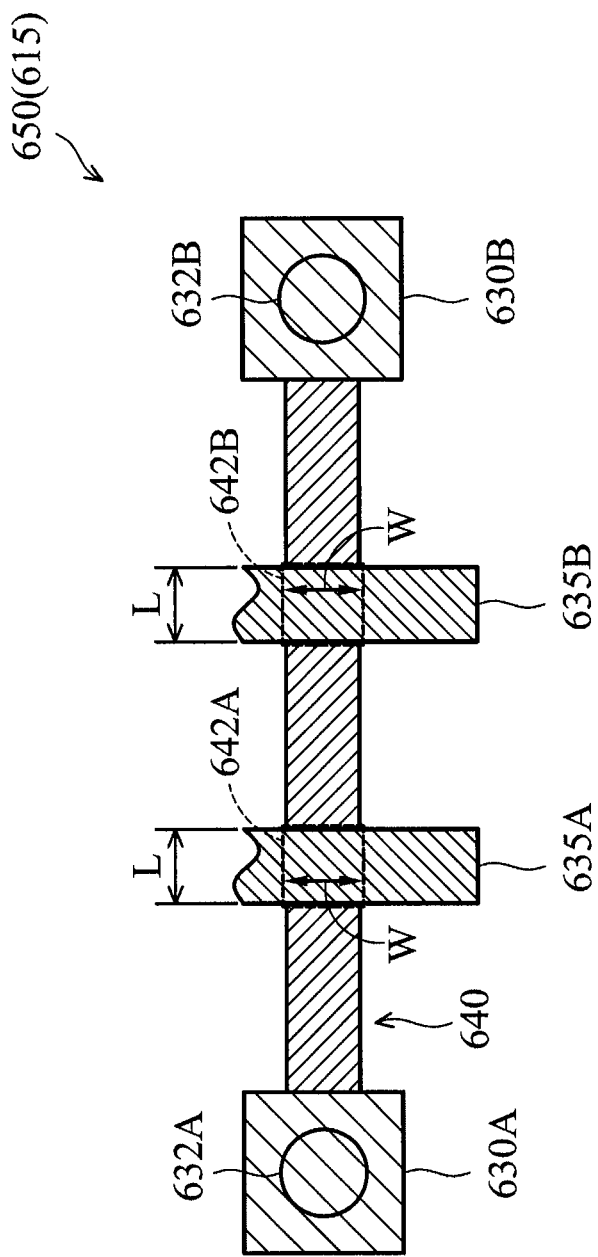

FIGS. 6B and 6C illustrate exemplary dual gate transistor arrangements 625, 650, according to embodiments described herein. The transistor arrangement 625 depicted in FIG. 6B may generally be used for any dual gate transistor having a single (or common) input to the two gates, such as the dual gate transistors 605, 610 depicted in FIG. 6A. The transistor arrangement 650 depicted in FIG. 6C may generally be used for any dual gate transistor having two independent inputs to the two gates, such as the dual gate transistor The arrangements 625, 650 each include a first source/drain (S/D) terminal 630A and a second S/D terminal 630B. Although not explicitly depicted, the first S/D terminal 630A and the second S/D terminal 630B may be coupled with other circuitry at the same layer and/or at other layers of the display device through conductive contacts. The first S/D terminal 630A and the second S/D terminal 630B are disposed at two opposite sides of a semiconductor layer 640, the first S/D terminal 630A is coupled to the semiconductor layer 640 through a first via 632A, and the second S/D terminal 630B is coupled to the semiconductor layer 640 through a second via 632B. The first via 632A and the second via 632B penetrate through an insulating layer which is disposed between semiconductor layer 640 and the first S/D terminal 630A (or the second S/D terminal 630B). In arrangement 625, two sections of a single gate terminal 635 overlap the semiconductor layer 640 to form a first channel 642A and a second channel 642B, the first channel 642A and the second channel 642B are disposed between the first S/D terminal 630A and the second S/D terminal 630B, and the first channel 642A and the second channel 642B individually defines a respective width W and a respective length L (the width W and the length L of two channel may be the same or different) that is used to describe the channel W/L ratio for the transistor. In arrangement 650, two different gate terminals 635A, 635B overlap the channel 640, and each gate terminal 635A, 635B overlap the semiconductor layer 640 to form a first channel 642A and a second channel 642B which are individually defines a respective width W and a respective length L that is used to describe the channel W/L ratio for the transistor.

Figure 13:
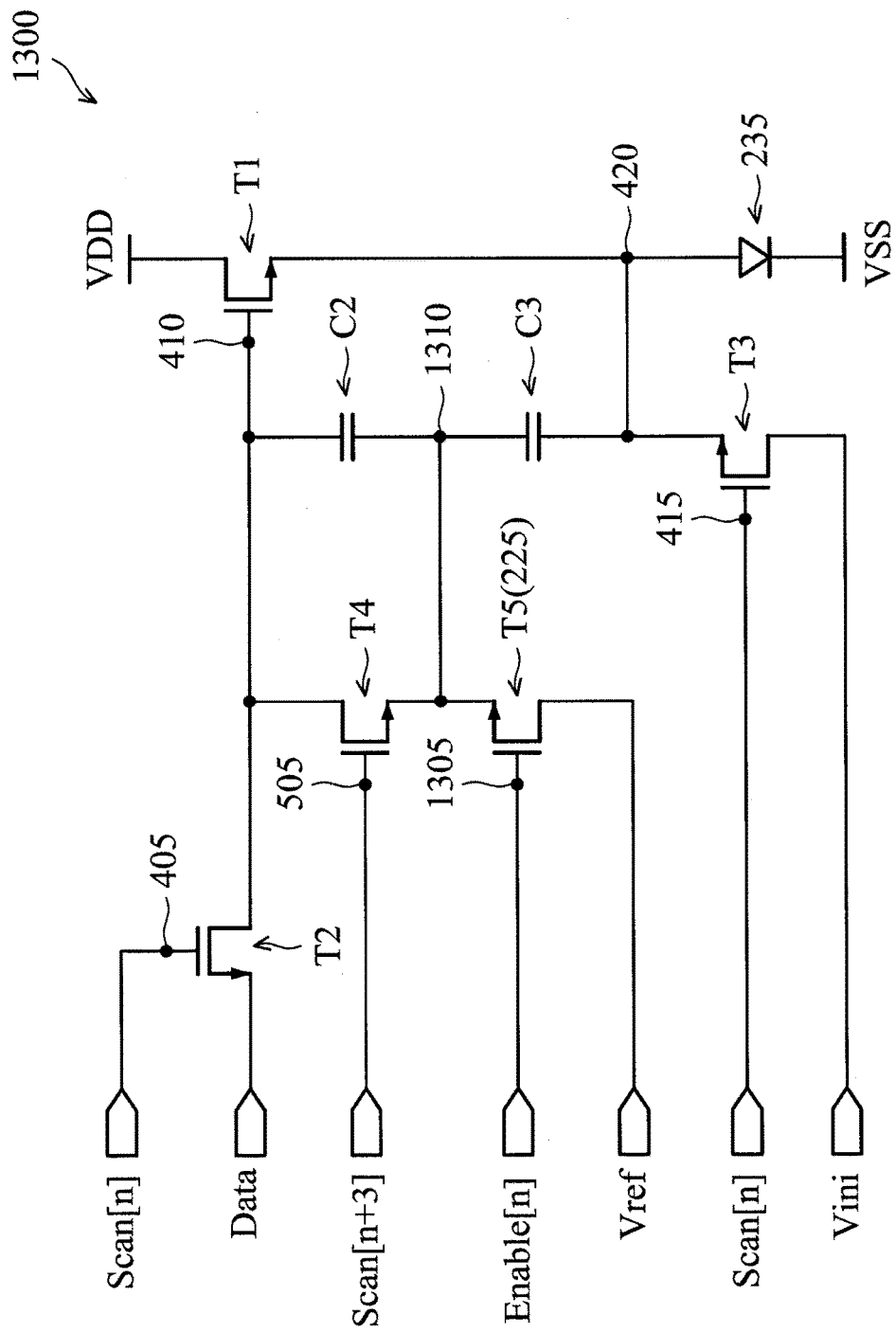
FIG. 13 is a circuit diagram illustrating an exemplary arrangement of pixel driver circuitry, according to embodiments described herein.

FIG. 13 is a circuit diagram illustrating an exemplary arrangement 1300 of pixel driver circuitry, according to embodiments described herein. The arrangement 1300 represents one possible implementation of the pixel driver circuitry 200 of FIG. 2. The arrangement 1300 comprises the drive transistor T1, the data input transistor T2, the reset transistor T3, the emission transistor T4, and a compensation transistor T5 comprising a fifth control terminal 1305. The compensation transistor T5 represents one example of a compensation element 225 (FIG. 2) configured to compensate for poor threshold voltage uniformity of a semiconductor material and/or different threshold voltages for different types of semiconductor materials of the arrangement 1300. Based on a fourth control signal (a current value of Enable [n]) received at the fifth control terminal 1305, the compensation transistor T5 is configured to couple the emission transistor T4 with a second reference voltage $V_{ref}$ across a fifth channel of the compensation transistor T5. In arrangement 1300, a current value of the Scan signal (Scan[n]) is the first control signal provided to the first control terminal 405 of the data input transistor T2 and is the second control signal provided to the third control terminal 415 of the reset transistor T3. The third control signal provided to the fourth control terminal 505 of emission transistor T4 is a current value of the Scan signal (Scan[n+3]). A first capacitor C2 is coupled between the second control terminal 410 of the drive transistor T1 and a node 1310, and a second capacitor C3 is coupled between the node 1310 and the input node 420.

In one embodiment, the drive transistor T1 is formed of IGZO semiconductor material, and each of the data input transistor T2, the reset transistor T3, the emission transistor T4, and the compensation transistor T5 are formed of LTPS semiconductor material. In some cases, the data input transistor T2 and/or the reset transistor T3 have a dual gate implementation to mitigate leakage current. The dimensions of the transistors T1, T2, T3, and T4 may generally correspond to those provided in Table 5, and the dimension of the compensation transistor T5 is the same as the transistors T2, T3, or T4 in Table 5.

In another embodiment, the emission transistor T4 is formed of LTPS semiconductor material for improved stability, and each of the drive transistor T1, the data input transistor T2, the reset transistor T3, and the compensation transistor T5 are formed of IGZO semiconductor material. Alternately, one of the data input transistor T2 and the reset transistor T3 may be formed of LTPS semiconductor material. The dimensions of the transistors T1, T2, T3, T4 may generally correspond to those provided in Table 3, and the dimension of the compensation transistor T5 is the same as the transistors T1, T2, or T3 in Table 3.

Exemplary Display Device Structures

Figure 7:
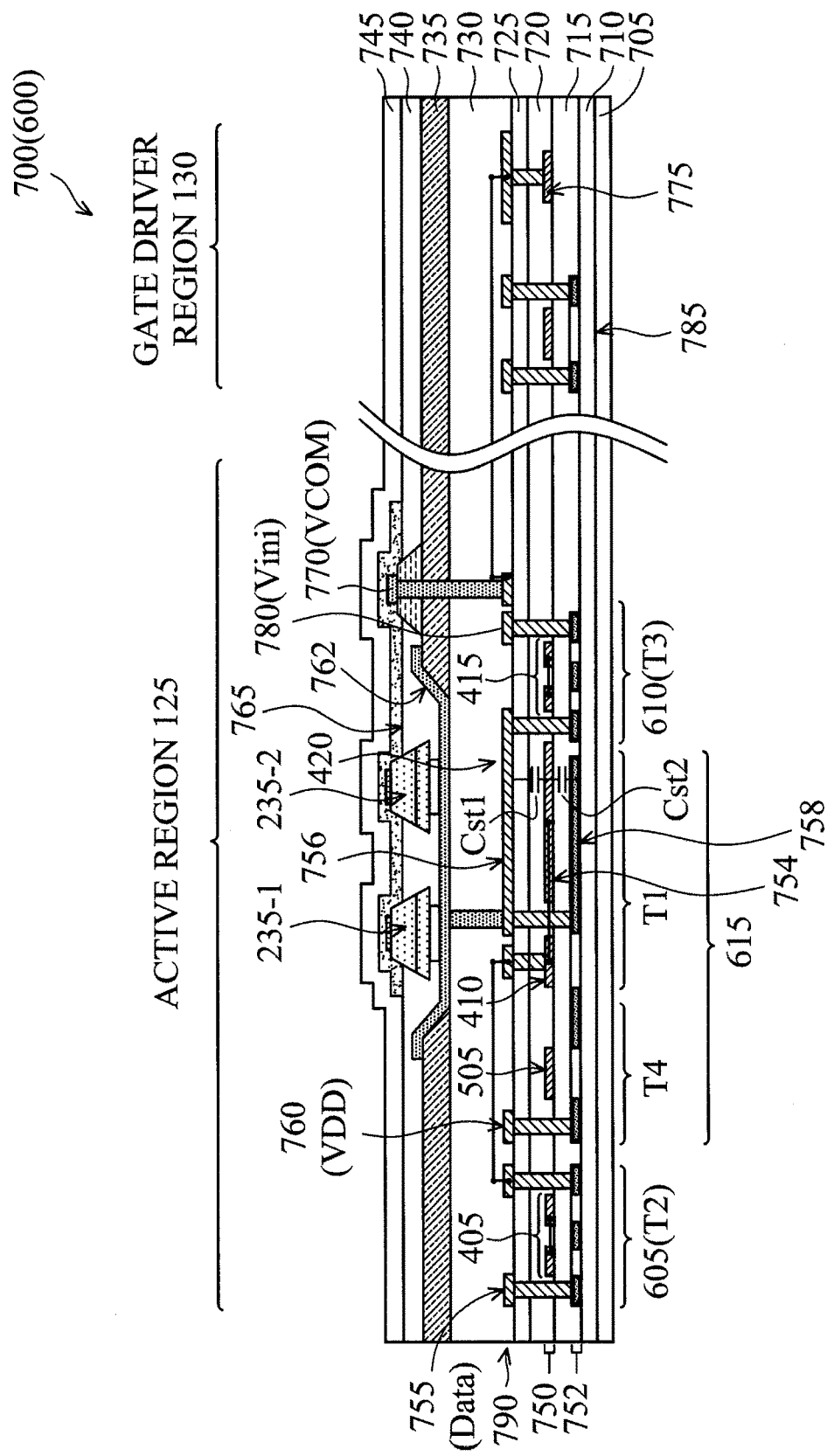
FIGS. 7-9 are schematic diagrams of exemplary display device implementations, according to embodiments described herein.
Figure 8:
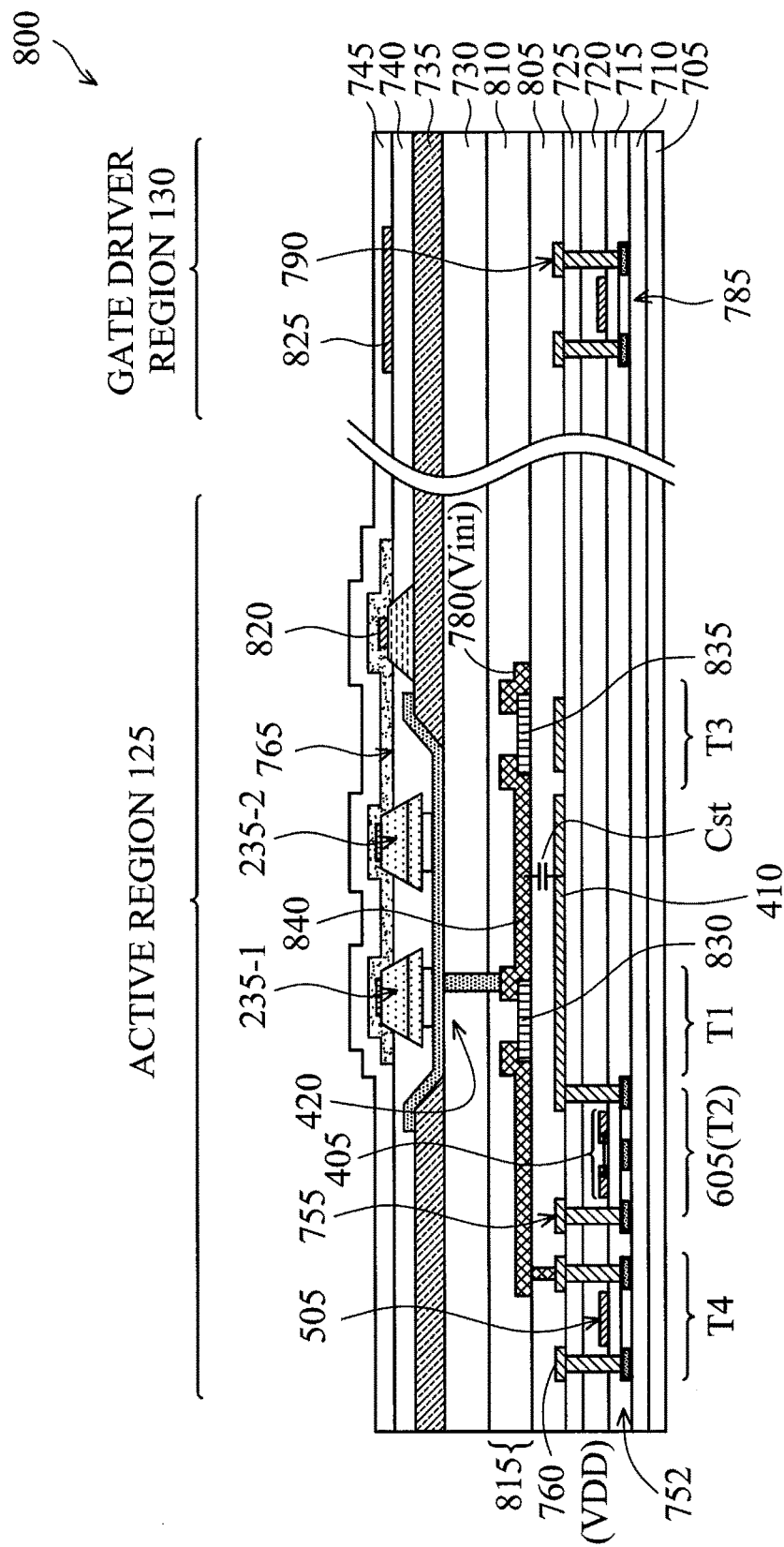
Figure 9:
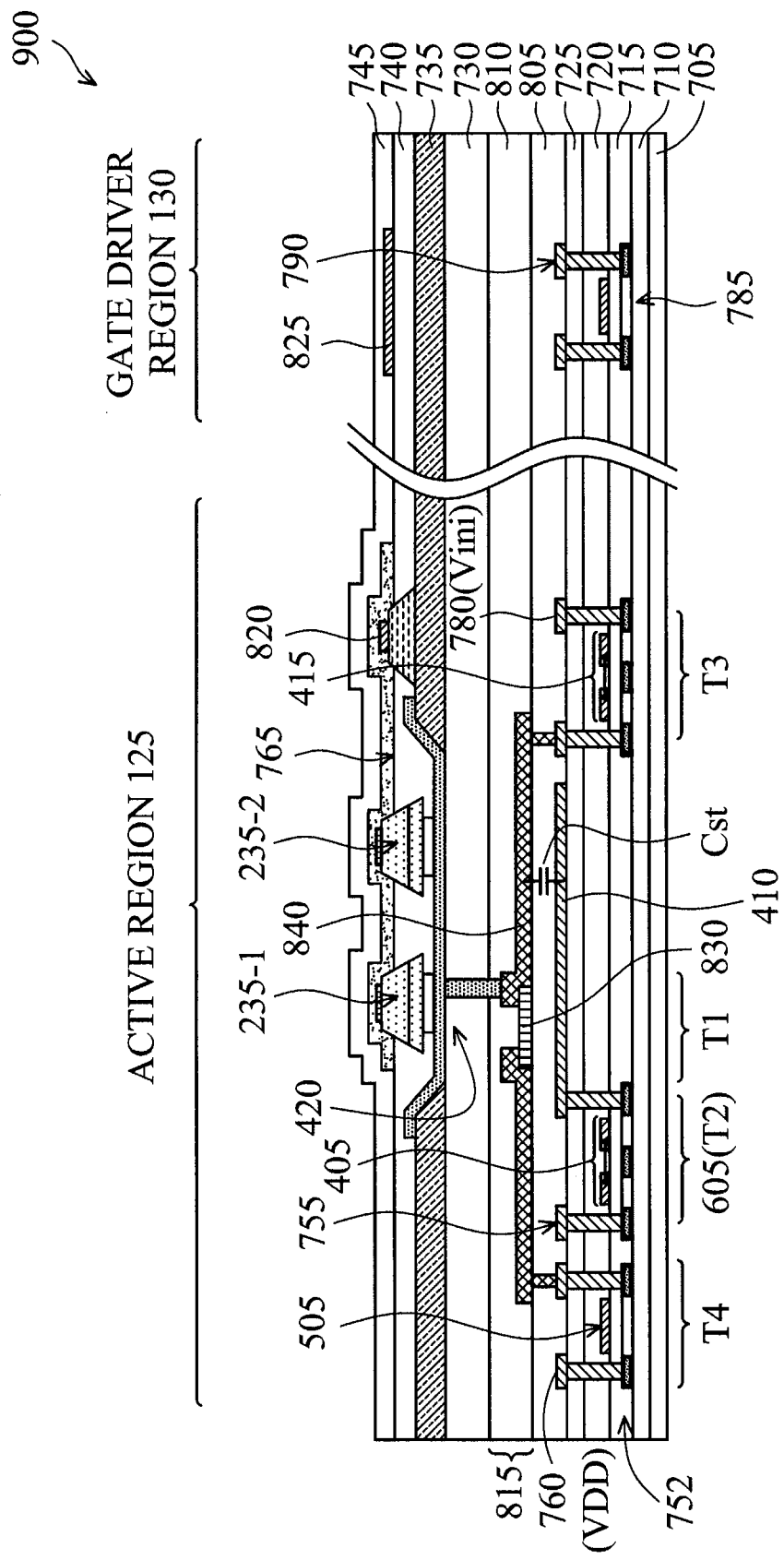

FIGS. 7-9 are schematic diagrams of exemplary display device implementations, according to embodiments described herein. More specifically, FIG. 7 depicts a cross-sectional view of an exemplary display device 700. The display device 700 includes two LEDs 235-1, 235-2 within one sub-pixel and pixel driver circuitry corresponding to the arrangement 600 depicted in FIG. 6. The transistors T1, T2, T3, T4 are formed of a semiconductor material (e.g., LTPS) and arranged within an active region 125 of the display device.

The display device 700 comprises a plurality of layers including a substrate layer 705 (or "substrate"), a buffer insulator layer 710, a gate insulator layer 715, an interlayer dielectric layer 720, an interlayer dielectric layer 725, a planarization layer 730, a pixel define layer 735, and passivation layers 740, 745. The material of the substrate layer 705 could be glass, plastic, metal foil, or other suitable material for supporting. The buffer insulator layer 710, the gate insulator layer 715, the interlayer dielectric layer 720, the interlayer dielectric layer 725, the planarization layer 730, the pixel define layer 735, and the passivation layers 740, 745 may be single layered or multi-layered. The materials of buffer insulator layer 710, the gate insulator layer 715, the interlayer dielectric layer 720, the interlayer dielectric layer 725, the planarization layer 730, the pixel define layer 735, and the passivation layers 740, 745 may comprise inorganic insulating material (such as silicon nitride, silicon oxide, silicon oxynitride, aluminium oxide, or other materials with insulating properties), organic insulating material, or a combination of inorganic materials and organic materials. The pixel driver circuitry overlaps a first region of the substrate 705 within the active region 125, and gate driver circuitry 785 overlaps a second region of the substrate 705 within the gate driver region 130. While various example layers are shown in display device 700, alternate embodiments may include a different number and/or composition of layers.

Gate terminals for the transistors T1, T2, T3, T4 are formed within a first conductive layer 750. Each of the data input transistor T2 and the reset transistor T3 has a dual gate implementation. The drive transistor T1 includes a control (gate) terminal 410 and a plate element 754 for forming the storage capacitor Cst with other layers. The control terminal 410 and the plate element 754 are coupled. The gate insulator layer 715 separates a semiconductor layer 752 (e.g., LTPS) from the first conductive layer 750. The semiconductor layer 752 forms the channels of the transistors T1, T2, T3, T4.

A first conductive connection 755 extends from a conductive layer 790 through the gate insulator layer 715 and interdielectric layers 720, 725 and couples the semiconductor layer 752, and the first conductive connection 755 couples an input data signal (Data) to a source/drain terminal of the data input transistor T2. A second conductive connection 760 extends from the conductive layer 790 through the gate insulator layer 715 and interdielectric layers 720, 725 and couples the semiconductor layer 752, and the second conductive connection 760 couples a supply voltage VDD to a source/drain terminal of the emission transistor T4. A third conductive connection 780 extends from the conductive layer 790 through the gate insulator layer 715 and interdielectric layers 720, 725 and couples the semiconductor layer 752, and the third conductive connection 780 couples a reference voltage $V_{ini}$ to a source/drain terminal of the reset transistor T3.

In this embodiment, the storage capacitor Cst is formed from a parallel combination of storage capacitor Cst1 (representing a capacitance between the plate element 754 of drive transistor T1 and the conductive connection 756 forming a portion of input node 420) and storage capacitor Cst2 (representing a capacitance between the plate element 754 and a portion 758 of the drive transistor T1 within the semiconductor layer 752. In some embodiments, the drive transistor T1 overlaps a first region of the substrate 705 and the storage capacitor Cst overlaps a second region of the substrate 705, and the LEDs 235-1 and/or 235-2 overlap at least one of the first region and the second region.

A first terminal of each of the LEDs 235-1, 235-2 is coupled with the input node 420 via a conductive layer 762 that partially overlaps the planarization layer 730 and the pixel define layer 735. A second terminal of each of the LEDs 235-1, 235-2 is coupled with a common voltage ("VCOM") node 770 via a conductive layer 765 formed between the passivation layers 740, 745. In some embodiments, the first terminals of the LEDs 235-1, 235-2 comprise anodes, and the second terminals of the LEDs 235-1, 235-2 comprise cathodes. In other embodiments, the first terminals comprise cathodes and the second terminals comprise anodes. A conductive connection 770 extends through the passivation layer 740, pixel define layer 735, and planarization layer 730, and couples the conductive layer 765 with a common voltage node 775 overlapping the second region of the substrate 705. In some embodiments, the common voltage node 775 is disposed within the first semiconductor layer 750 and is coupled with an IC that supplies the common voltage.

FIG. 8 depicts a cross-sectional view of an exemplary display device 800. The display device 800 includes two LEDs 235-1, 235-2 and pixel driver circuitry. Display device 800 differs from display device 700 of FIG. 7 in that display device 800 includes one or more transistors formed within an oxide semiconductor layer 815 includes a second channels 830 and a third channel 835. The display device 800 includes dielectric layers 805, 810 between the interdielectric layer 725 and the planarization layer 730. The dielectric layers 805, 810 may be single layered or multi-layered. The dielectric layers 805, 810 may comprise inorganic insulating material (such as silicon nitride, silicon oxide, silicon oxynitride, aluminium oxide, or other materials with insulating properties), organic insulating material, or a combination of inorganic materials and organic materials.

As shown, the second channel 830 of the drive transistor T1 and the third channel 835 of the reset transistor T3 are formed within the oxide semiconductor layer 815 (e.g., a layer of IGZO semiconductor material). A source/drain terminal 840 of the drive transistor T1 is formed in the oxide semiconductor layer 815 and forms part of the input node 420 coupled with the conductive layer 762 and LEDs 235-1, 235-2. The first channel of the data input transistor T2 and a fourth channel of the emission transistor T4 are formed in the semiconductor layer 752. Alternate embodiments may have a different distribution of transistors in the semiconductor layer 752 and the oxide semiconductor layer 815.

As shown, a conductive connection 820 provides a common voltage to the conductive layer 765. Instead of extending through a plurality of different layers of the display device 800, the conductive connection 820 is coupled with a common voltage node 825 overlapping with the gate driver region 130. In some embodiments, the common voltage node 825 is disposed in a same plane as the conductive connection 820 and is coupled with an IC that supplies the common voltage.

FIG. 9 depicts a cross-sectional view of an exemplary display device 900. Display device 900 includes the second channel 830 of the drive transistor within the oxide semiconductor layer 815, and the channels of the data input transistor T2, the reset transistor T3, and the emission transistor T4 within the semiconductor layer 752.

Exemplary Arrangements of Common/Ground Lines

Figure 10A:
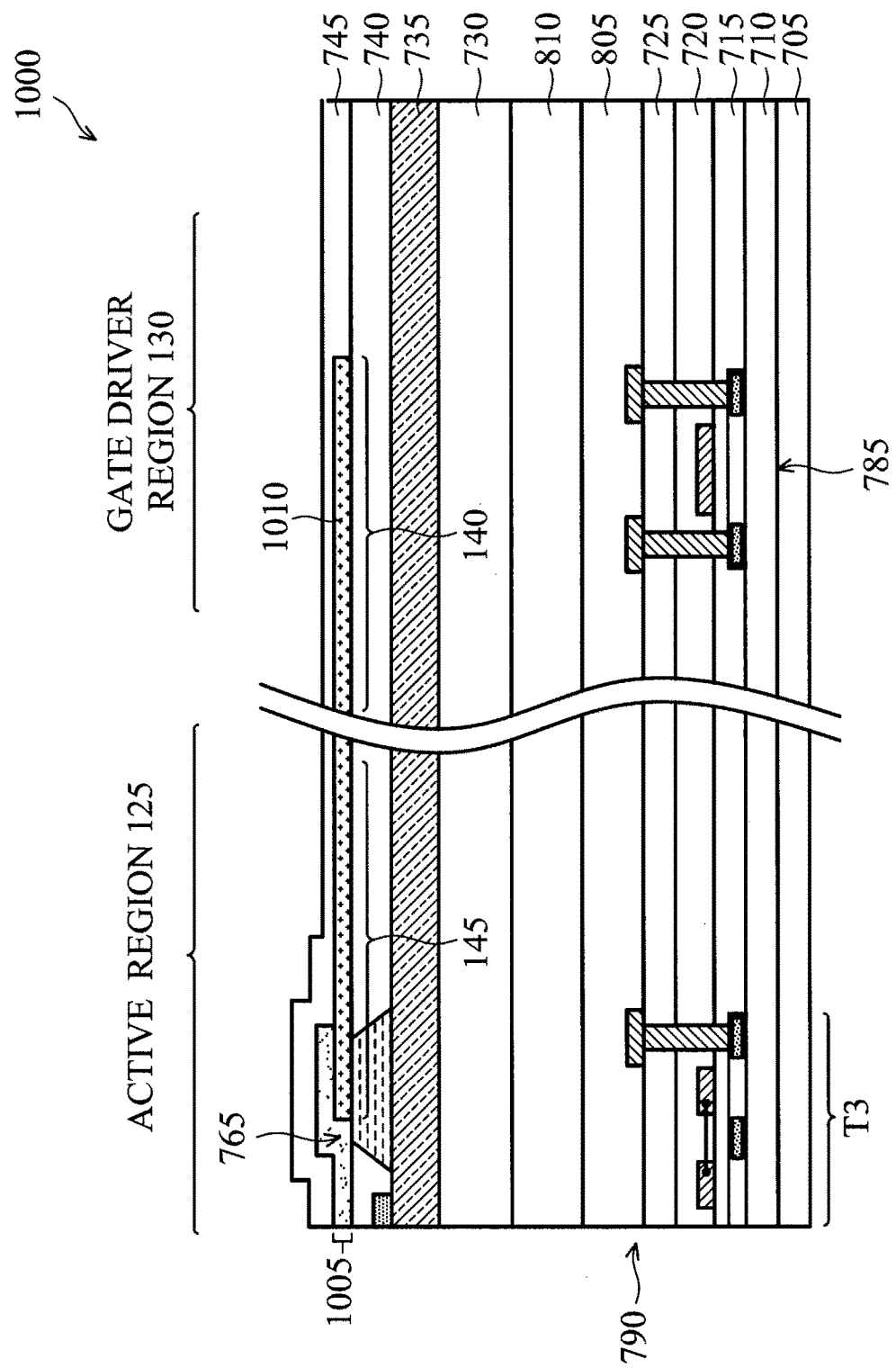
FIGS. 10A-10C are schematic diagrams illustrating exemplary arrangements of common or ground lines within a display device, according to embodiments described herein.
Figure 10B:
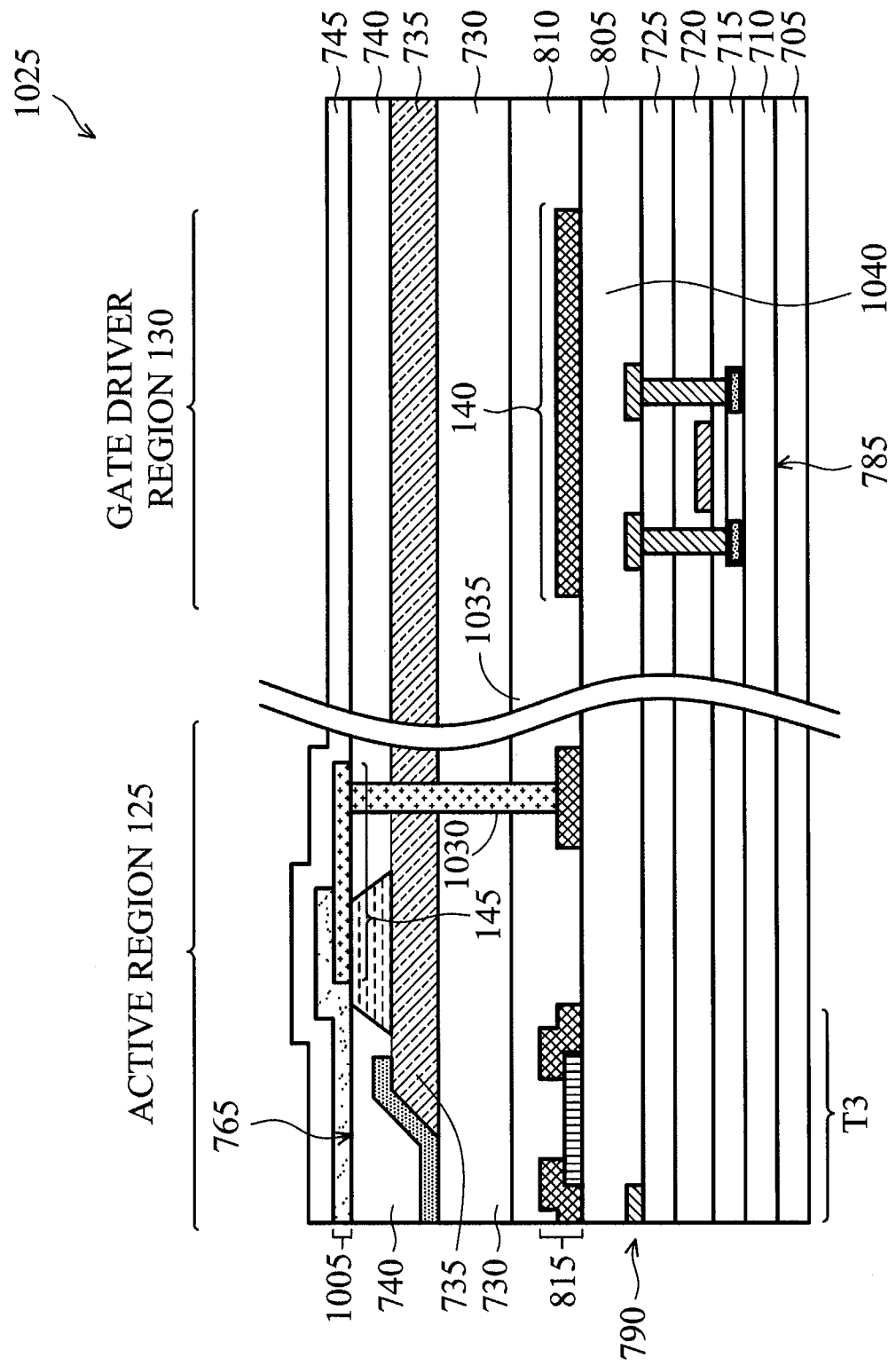
Figure 10C:
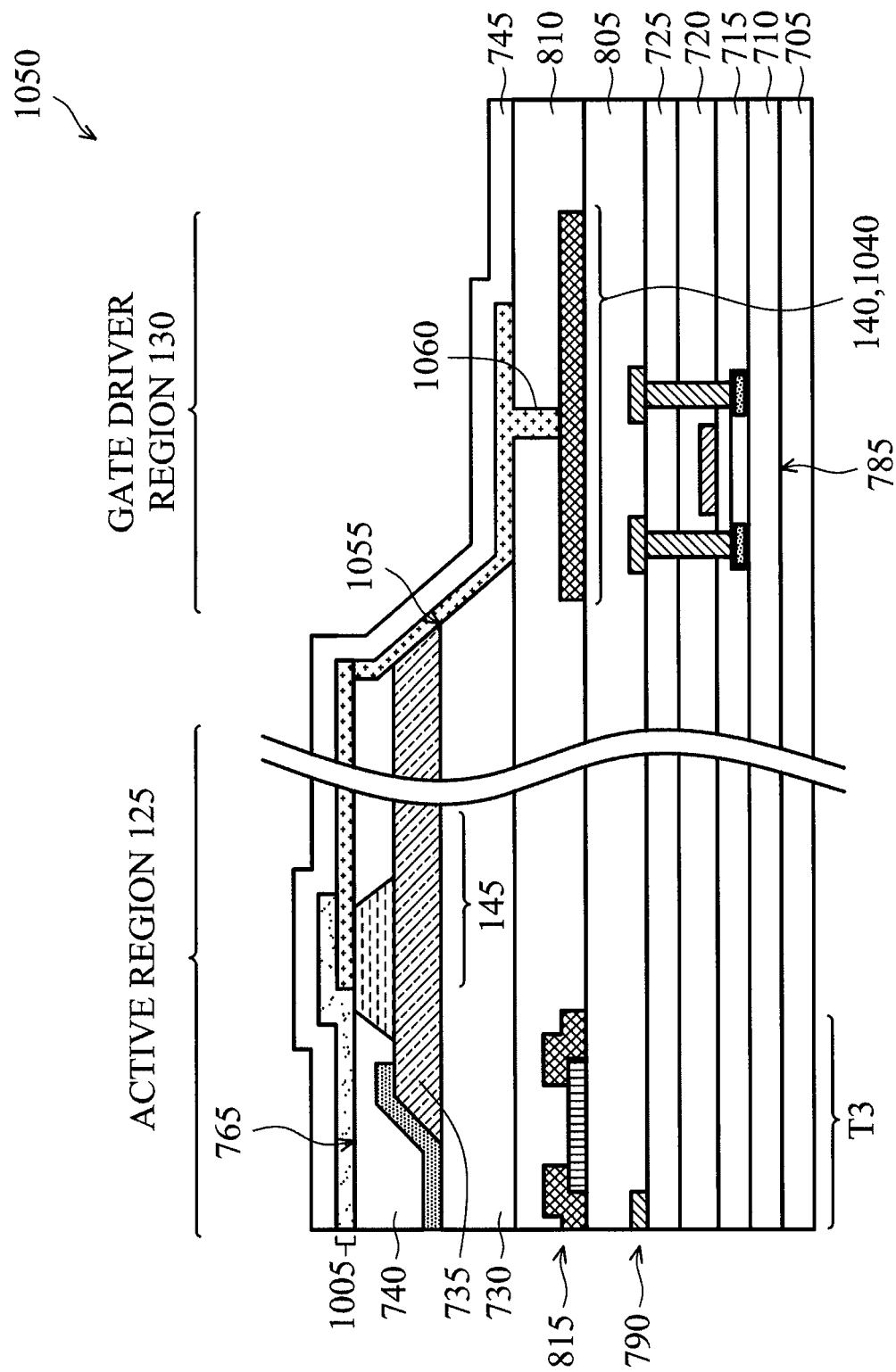

FIGS. 10A-10C are schematic diagrams illustrating exemplary arrangements 1000, 1025, 1050 of common or ground lines within a display device, according to embodiments described herein. The arrangements 1000, 1025, 1050 may generally be used in conjunction with any of the display device implementations discussed herein.

FIG. 10A depicts a cross-sectional view of a portion of an exemplary display device. More specifically, a portion of the pixel driver circuitry is omitted from the view for clarity. Within the arrangement 1000, the common voltage node 1010 is arranged in a conductive layer 1005 between the passivation layers 740, 745. The conductive layer 1005 may be formed of any suitable conductive material, such as a metal or an optically transmissive conductive material (e.g., indium tin oxide, or ITO).

The common voltage node 1010 is coupled with the conductive layer 765 (which connects with one or more LEDs). As shown, the common voltage node 1010 is formed by a conductive line 145 extending in the conductive layer 1005 from the active region 125 to the gate driver region 130, and a conductive ring 140 that is disposed in the conductive layer 1005 and within the gate driver region 130.

Within the arrangement 1025 of FIG. 10B, the common voltage node 1030 is formed by a conductive line 145 coupled with the conductive layer 765 within the active region 125, and extends through passivation layer 740, pixel define layer 735, planarization layer 730, and dielectric layer 810 to a conductive connection 1035 that is formed in the oxide semiconductor layer 815. The conductive connection 1035 is coupled with the conductive ring 140, which is arranged as a conductive connection 1040 formed in the oxide semiconductor layer 815 beneath one or more layers of the arrangement 1025.

Within the arrangement 1050 of FIG. 10C, the common voltage node 1055 is coupled with the conductive layer 765 in the active region 125, and extends from the active region 125 to the gate driver region 130. In arrangement 1050, the conductive layer 1005 is arranged between passivation layers 740, 745 within the active region 125, and generally follows a contour of the arrangement 1050 as the conductive layer 1005 extends into the gate driver region 130. As shown, the conductive layer 1005 follows a contour formed by the passivation layer 740, the pixel define layer 735, and the planarization layer 730. A conductive connection 1060 connects the common voltage node 1055 with the conductive ring 140, which is arranged as a conductive connection 1040 formed in the oxide semiconductor layer 815.

Direct Bonding of LED to Pixel Driver Circuitry

Figure 11:
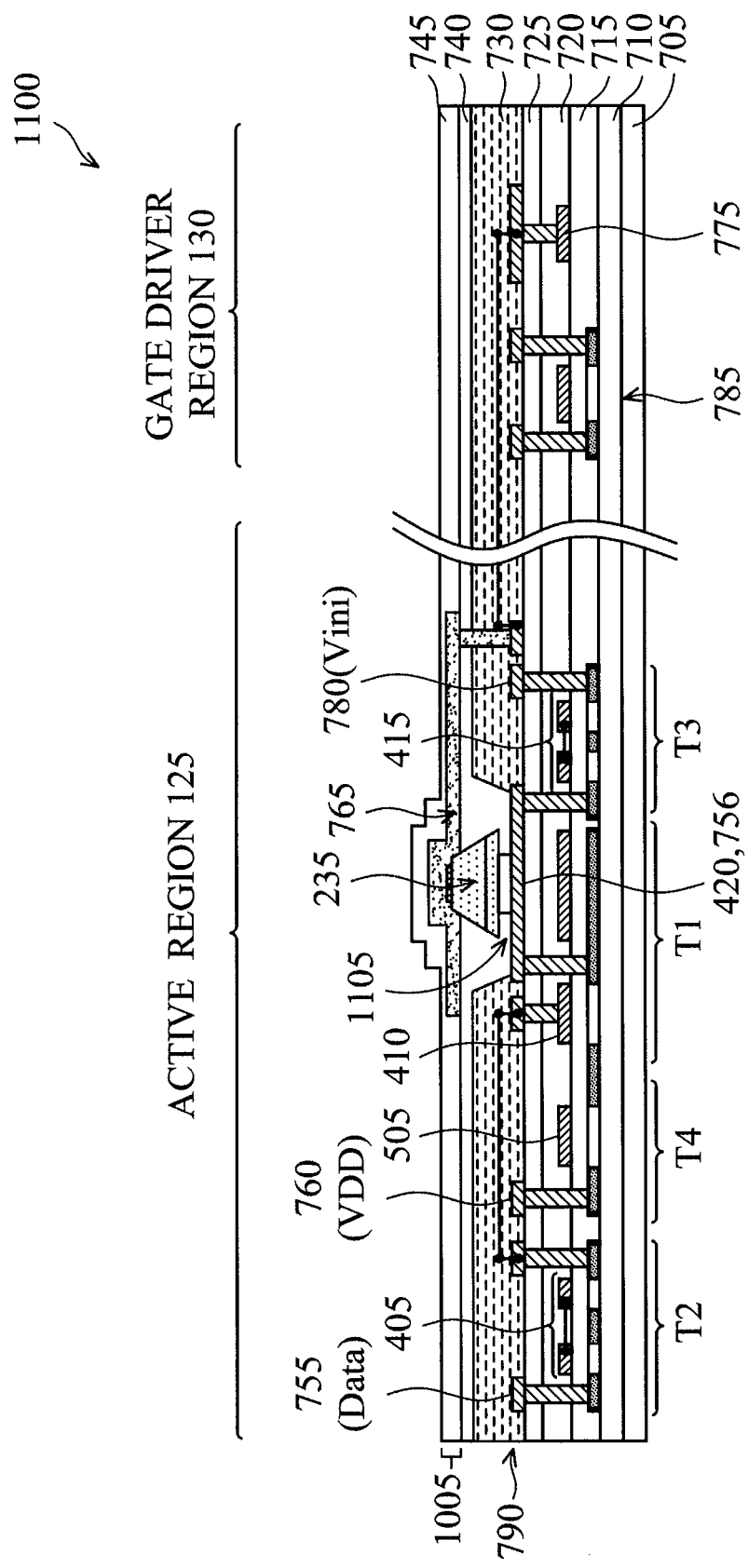
FIGS. 11 and 12 are schematic diagrams illustrating exemplary arrangements of a light emitting diode (LED) within a display device, according to embodiments described herein.
Figure 12:
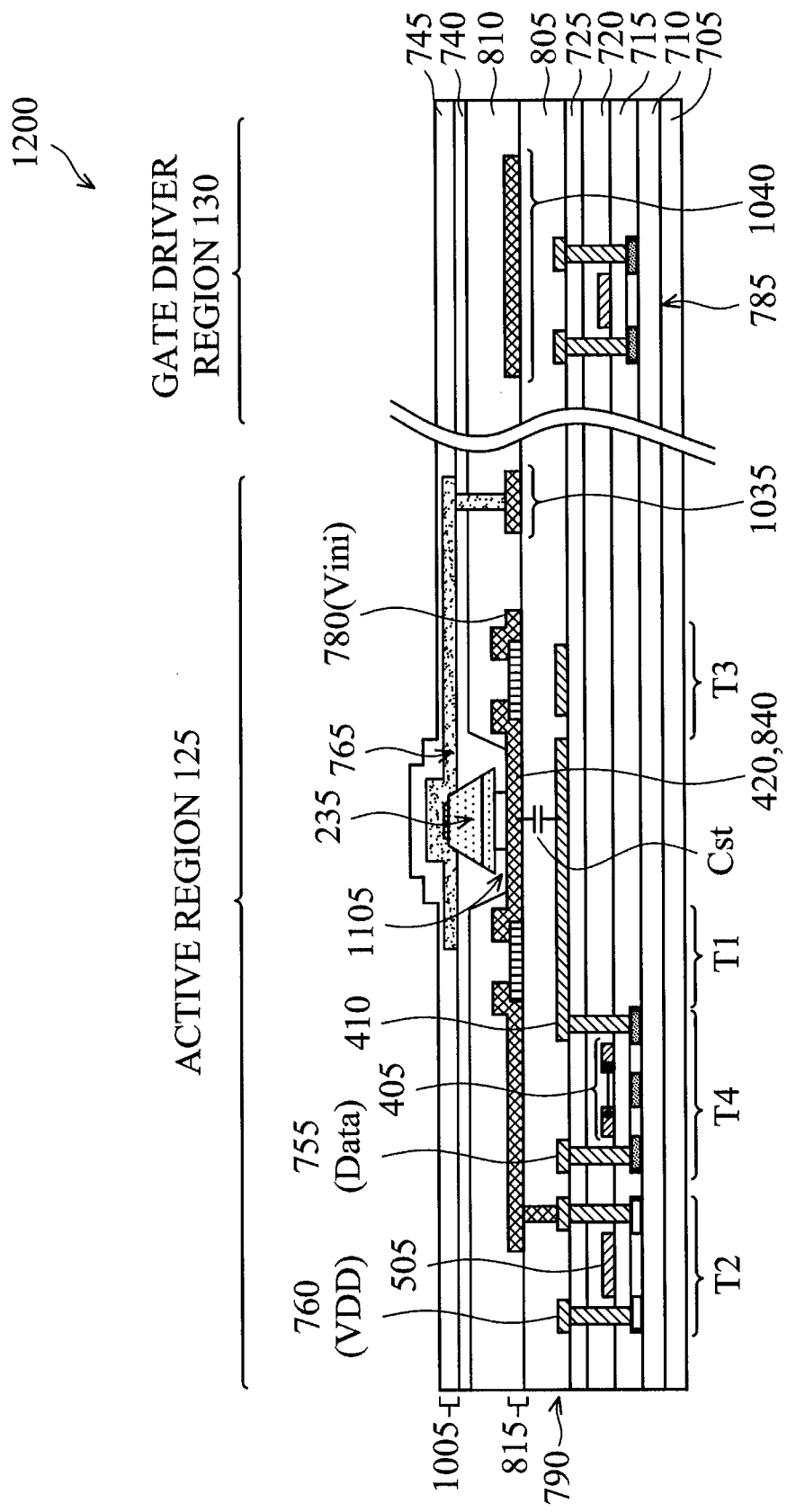

In various display device implementations discussed above, one or more LEDs 235-1, 235-2 are coupled with the input node of the pixel driver circuitry through a conductive layer 762, which can extend through one or more layers of the display device. FIGS. 11 and 12 are schematic diagrams illustrating exemplary arrangements 1100, 1200 of a LED 235 within a display device, according to embodiments described herein.

Within arrangement 1100, the first terminal of LED 235 is directly bonded using known bonding techniques to a conductive layer 790 at an interface 1105. The LED 235 is partly disposed within a feature etched into (or otherwise removed from) the planarization layer 730. As shown, the interface 1105 corresponds to the conductive connection 756 forming a portion of the input node 420. The conductive layer 765, which is coupled with the second terminal of LED 235, extends through the passivation layer 740 and the planarization layer 730 to a conductive connection within the conductive layer 790. Generally, direct bonding of the LED 235 to the conductive layer 790 included within the pixel driver circuitry can reduce the number of layers required in the display device, thus simplifying the manufacturing process and/or reducing an overall size of the display device.

Within arrangement 1200, the first terminal of LED 235 is directly bonded to the oxide semiconductor layer 815 at an interface 1205. The LED 235 is partly disposed within a feature etched into (or otherwise removed from) the dielectric layer 810. As shown, the interface 1205 corresponds to a conductive connection within the oxide semiconductor layer 815 forming a portion of the input node 420. The conductive layer 765, which is coupled with the second terminal of LED 235, extends through the passivation layer 740 and the dielectric layer 810 to a conductive connection 1035 arranged within the oxide semiconductor layer 815. Generally, direct bonding of the LED 235 to the oxide semiconductor layer 815 included within the pixel driver circuitry can reduce the number of layers required in the display device, thus simplifying the manufacturing process and/or reducing an overall size of the display device.

The various illustrative logical blocks, modules, circuits, and algorithm steps described in connection with the aspects disclosed herein may be implemented as electronic hardware, computer software, or combinations of both. Various changes and modifications may be made herein without departing from the scope of the appended claims. Further, the functions, steps, or actions described in the method claims in accordance with aspects described herein need not be performed in any particular order unless expressly stated otherwise.

In view of the foregoing, the scope of the present disclosure is determined by the claims that follow.

What is claimed is:

1. A display device comprising:
   at least a first light emitting diode coupled with an input node; and
   pixel driver circuitry comprising:
   a data input transistor comprising a first control terminal configured to receive a first control signal, wherein the data input transistor is configured to conduct, based on the first control signal, a data signal across a first channel of the data input transistor having a first channel width-to-length (W/L) ratio;
   a drive transistor comprising a second control terminal configured to receive the data signal from the data input transistor, wherein the drive transistor is configured to conduct, based on the data signal, current across a second channel of the drive transistor into the input node, wherein the second channel has a second channel W/L ratio; and
   a reset transistor comprising a third control terminal configured to receive a second control signal, wherein the reset transistor is configured to conduct, based on the second control signal, a first reference voltage signal across a third channel of the reset transistor into the input node, wherein the third channel has a third channel W/L ratio,
   wherein at least one of the first channel W/L ratio, the second channel W/L ratio, and the third channel W/L ratio is different;
   wherein the pixel driver circuitry further comprises:
   an emission transistor comprising a fourth control terminal configured to receive a third control signal for selectively enabling current conduction across the second channel of the drive transistor;
   a compensation transistor comprising a fifth control terminal configured to receive a fourth control signal, wherein the compensation transistor is configured to couple, based on the second control signal, the emission transistor with a second reference voltage across a fifth channel.

2. The display device of claim 1, wherein the second channel W/L ratio of the drive transistor is smaller than the first channel W/L ratio and is smaller than the third channel W/L ratio.

3. The display device of claim 1, wherein at least one of the data input transistor, the drive transistor, and the reset transistor has a dual gate structure.

4. The display device of claim 3, wherein the drive transistor has a dual gate structure comprising:
a first gate terminal configured to receive the data signal; and
a second gate terminal configured to receive the third control signal for selectively coupling the drive transistor with a supply voltage.

5. The display device of claim 1, wherein the second channel of the drive transistor is formed within an oxide semiconductor layer.

6. The display device of claim 5, wherein at least one of the first channel and the third channel are also formed within the oxide semiconductor layer.

7. The display device of claim 5,
wherein the emission transistor is formed within a semiconductor layer.

8. The display device of claim 1, wherein the pixel driver circuitry further comprises:
a first storage capacitor coupled between the second control terminal and the input node.

9. The display device of claim 8, wherein the pixel driver circuitry further comprises:
a second storage capacitor coupled between a supply voltage and the input node.

10. The display device of claim 8, further comprising:
a substrate,
wherein the drive transistor overlaps a first region of the substrate and the first storage capacitor overlaps a second region of the substrate, and
wherein the first light emitting diode is overlaps at least one of the first region and the second region.

11. The display device of claim 8, wherein the first light emitting diode is directly bonded to a portion of the drive transistor formed from a metal layer.

12. The display device of claim 1, wherein the emission transistor is configured to couple, based on the third control signal, the drive transistor with a supply voltage across a fourth channel.

13. The display device of claim 1, further comprising:
a substrate, wherein the pixel driver circuitry overlaps a first region of the substrate; and
gate driver circuitry overlapping a second region of the substrate,
wherein the first light emitting diode comprises:
a first terminal coupled with the input node; and
a second terminal coupled with a common voltage node overlapping the second region.

14. The display device of claim 13, wherein at least a portion of the gate driver circuitry is disposed outside an active region of the display device.

15. The display device of claim 14, further comprising:
a conductive ring configured to substantially circumscribe the active region,
wherein the gate driver circuitry and a cathode of the first light emitting diode are coupled with the conductive ring.

16. The display device of claim 15, further comprising:
a plurality of conductive lines extending across the active region and coupled with the conductive ring, wherein a first width of each conductive line of the plurality of conductive lines is smaller than a second width of the conductive ring.

17. The display device of claim 16, wherein each conductive line defines a respective first end and a respective second end, and
wherein each first end and each second end are coupled with the conductive ring.

18. The display device of claim 1, wherein the first light emitting diode comprises:
a first terminal coupled with the input node; and
a second terminal configured to receive a common voltage signal from circuitry other than the pixel driver circuitry.

* * * * *